United States Patent
Tsuchida et al.

(10) Patent No.: US 11,757,478 B2
(45) Date of Patent: *Sep. 12, 2023

(54) RADIO FREQUENCY MODULE AND COMMUNICATION DEVICE

(71) Applicant: Murata Manufacturing Co., Ltd., Nagaokakyo (JP)

(72) Inventors: Shigeru Tsuchida, Nagaokakyo (JP); Daerok Oh, Nagaokakyo (JP); Takahiro Katamata, Nagaokakyo (JP); Satoshi Goto, Nagaokakyo (JP); Mitsunori Samata, Nagaokakyo (JP); Yoshiki Yasutomo, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/955,570

(22) Filed: Sep. 29, 2022

(65) Prior Publication Data

US 2023/0020088 A1    Jan. 19, 2023

Related U.S. Application Data

(63) Continuation of application No. 17/066,492, filed on Oct. 9, 2020, now Pat. No. 11,489,547.

(30) Foreign Application Priority Data

Oct. 9, 2019    (JP) .................. 2019-186318
Mar. 27, 2020    (JP) .................. 2020-057833

(51) Int. Cl.
    *H04B 1/04*    (2006.01)
    *H03F 1/56*    (2006.01)
    *H03F 3/24*    (2006.01)

(52) U.S. Cl.
    CPC .................. *H04B 1/04* (2013.01); *H03F 1/56* (2013.01); *H03F 3/245* (2013.01);
    (Continued)

(58) Field of Classification Search
    None
    See application file for complete search history.

(56) References Cited

U.S. PATENT DOCUMENTS 7,236,802 B2    6/2007    Cairo
7,453,320 B2    11/2008    Shiikuma
(Continued)

FOREIGN PATENT DOCUMENTS

JP    2008-278345 A    11/2008
JP    2010-118916 A    5/2010
(Continued)

OTHER PUBLICATIONS

Office Action dated Aug. 18, 2021, in corresponding Korean patent Application No. 10-2020-0128616, 10 pages.

*Primary Examiner* — Pablo N Tran
(74) *Attorney, Agent, or Firm* — XSENSUS LLP

(57) ABSTRACT

A radio frequency module includes: a module board that includes a first principal surface and a second principal surface on opposite sides of the module board; a power amplifier; and a first circuit component. The power amplifier includes: a first amplifying circuit element; a second amplifying circuit element; and an output transformer that includes a primary coil and a secondary coil. An end of the primary coil is connected to an output terminal of the first amplifying circuit element. Another end of the primary coil is connected to an output terminal of the second amplifying circuit element. An end of the secondary coil is connected to an output terminal of the power amplifier. The first amplifying circuit element and the second amplifying circuit
(Continued)

element are disposed on the first principal surface. The first circuit component is disposed on the second principal surface.

10 Claims, 11 Drawing Sheets

(52) U.S. Cl.
CPC .. *H03F 2200/171* (2013.01); *H03F 2200/222* (2013.01); *H03F 2200/451* (2013.01); *H04B 2001/0408* (2013.01)

(56) References Cited

U.S. PATENT DOCUMENTS

| | | | |
|---|---|---|---|
| 7,459,981 B2* | 12/2008 | Floyd | H03F 3/604 |
| | | | 330/307 |
| 8,816,769 B2 | 8/2014 | Moreira | |
| 10,218,310 B2 | 2/2019 | Arfaei Malekzadeh et al. | |
| 11,489,547 B2* | 11/2022 | Tsuchida | H03F 3/195 |
| 2005/0248402 A1* | 11/2005 | Zhenbiao | H03F 1/0261 |
| | | | 330/129 |
| 2009/0219908 A1* | 9/2009 | Rofougaran | H04B 1/0057 |
| | | | 370/343 |
| 2009/0273398 A1* | 11/2009 | Yu | H03F 1/0288 |
| | | | 330/124 R |
| 2010/0237941 A1 | 9/2010 | Goldfarb et al. | |
| 2011/0143690 A1 | 6/2011 | Jerng et al. | |
| 2013/0335182 A1 | 12/2013 | Zybura et al. | |
| 2013/0344838 A1 | 12/2013 | Li et al. | |
| 2014/0002188 A1* | 1/2014 | Chen | H03F 3/213 |
| | | | 330/250 |
| 2014/0015614 A1* | 1/2014 | Oliveira | H03F 1/347 |
| | | | 330/307 |
| 2014/0097907 A1* | 4/2014 | Yoon | H01L 23/5227 |
| | | | 330/307 |
| 2014/0253234 A1 | 9/2014 | Lee et al. | |
| 2015/0366099 A1 | 12/2015 | Lee | |
| 2016/0190996 A1 | 6/2016 | Searle | |
| 2016/0284651 A1* | 9/2016 | Lesenco | H01L 23/5227 |
| 2019/0103843 A1 | 4/2019 | Aikawa | |
| 2020/0186111 A1 | 6/2020 | Dandu et al. | |

FOREIGN PATENT DOCUMENTS

| | | |
|---|---|---|
| JP | 2017-135356 A | 8/2017 |
| JP | 2019-68205 A | 4/2019 |
| KR | 2015-0142280 A | 12/2015 |
| KR | 10-1931682 B1 | 12/2018 |
| KR | 2019-0076669 A | 7/2019 |

* cited by examiner

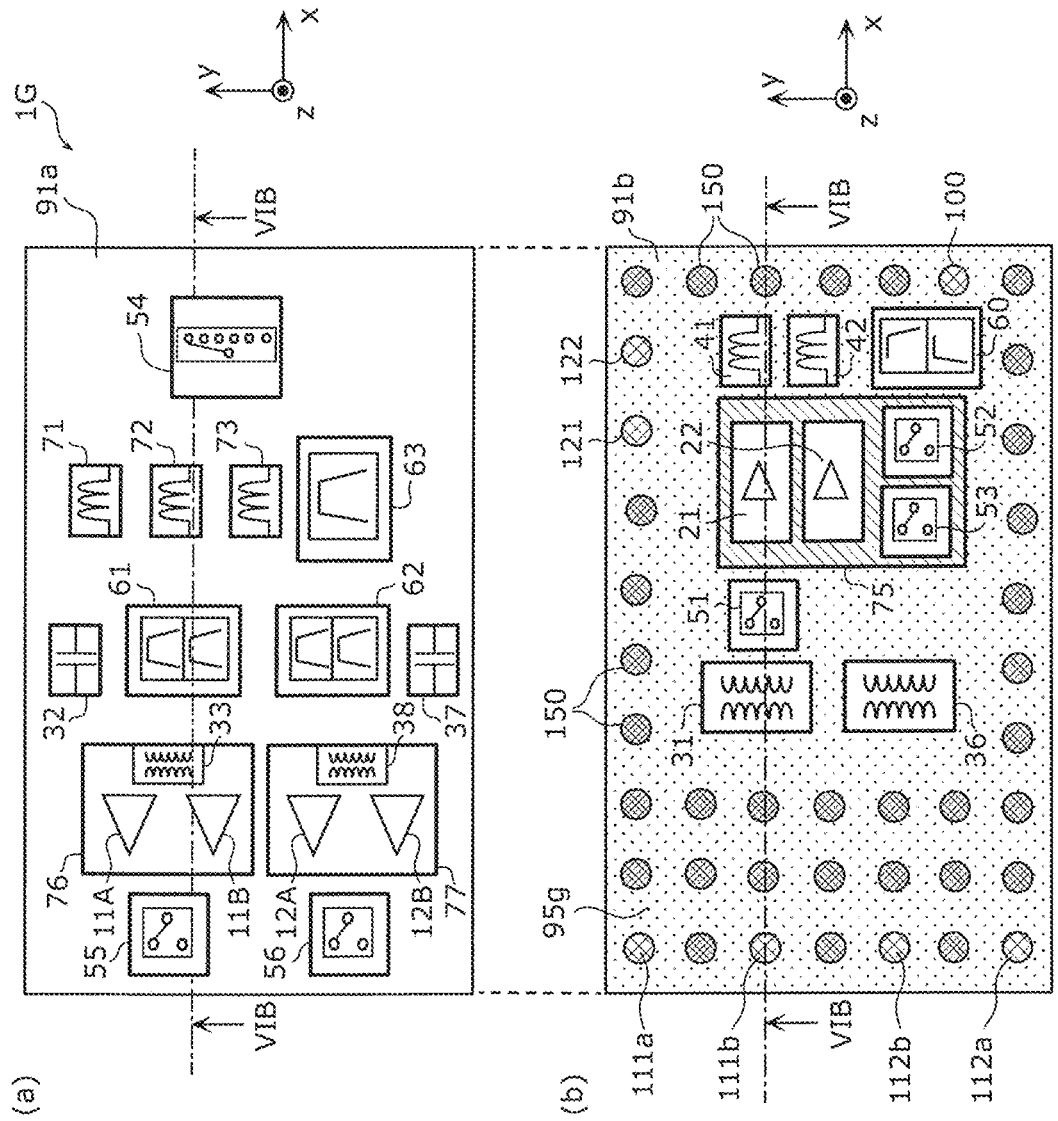

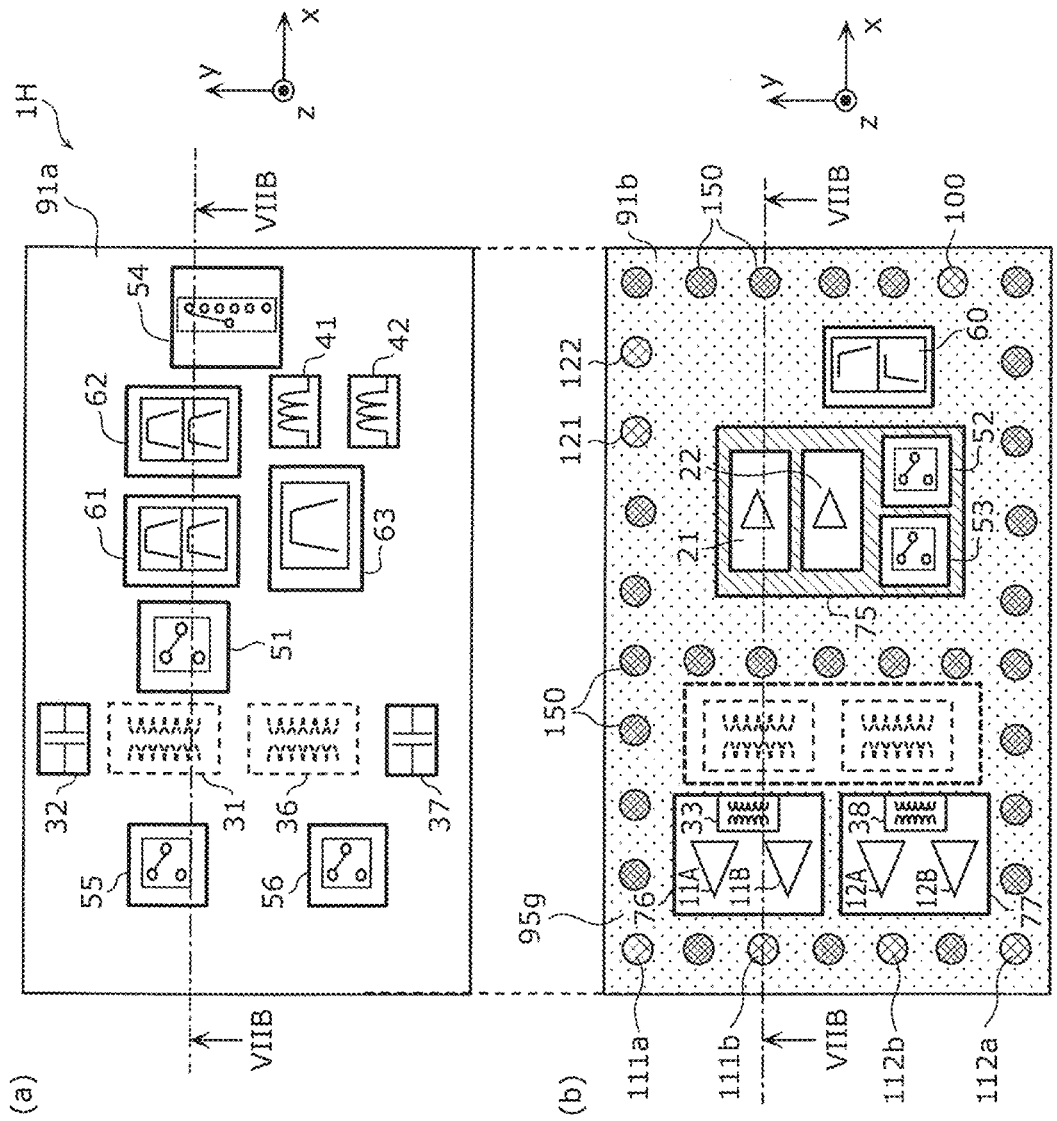

RADIO FREQUENCY MODULE AND COMMUNICATION DEVICE

CROSS-REFERENCE TO RELATED APPLICATIONS

The present application is a continuation of U.S. application Ser. No. 17/066,492, filed Oct. 9, 2020, which is based on and claims priority of Japanese Patent Applications No. 2019-186318 filed on Oct. 9, 2019 and No. 2020-057833, filed on Mar. 27, 2020. The entire disclosures of the above-identified applications, including the specifications, drawings and claims are incorporated herein by reference in their entirety.

TECHNICAL FIELD

The present disclosure relates to a radio frequency module and a communication device.

BACKGROUND

A power amplifier that amplifies a radio frequency (RF) transmission signal is provided in a mobile communication apparatus such as a mobile phone.

Japanese Unexamined Patent Application Publication No. 2010-118916 discloses a difference amplifying type power amplifier that includes a first transistor to which a non-inverted input signal is input, a second transistor to which an inverted input signal is input, and a transformer disposed on the output terminal side of the first transistor and the second transistor. The transformer includes two magnetically coupled primary coils and one secondary coil. The two primary coils are connected in parallel, and are each magnetically coupled with the secondary coil, so that the input impedance of the primary coils can be decreased without decreasing the Q factor. Accordingly, power gain can be improved.

SUMMARY

Technical Problems

However, as recognized by the present inventor, if the difference amplifying type power amplifier disclosed in Japanese Unexamined Patent Application Publication No. 2010-118916 is achieved using one radio frequency module, many circuit elements are included in the power amplifier, which results in an increase in the size of the radio frequency module.

The present disclosure has been conceived to solve the above-identified and other problems, and is to provide a small radio frequency module that includes a difference amplifying type power amplifier, and a communication device that includes the radio frequency module.

Solutions

In order to achieve the above object, a radio frequency module according to an aspect of the present disclosure includes: a module board that includes a first principal surface and a second principal surface on opposite sides of the module board; a power amplifier configured to amplify a transmission signal; and a first circuit component. The power amplifier includes: a first amplifying circuit element; a second amplifying circuit element; and an output transformer that includes a first coil and a second coil. An end of the first coil is connected to an output terminal of the first amplifying circuit element, and another end of the first coil is connected to an output terminal of the second amplifying circuit element. An end of the second coil is connected to an output terminal of the power amplifier. The first amplifying circuit element and the second amplifying circuit element are disposed on the first principal surface. The first circuit component is disposed on the second principal surface.

Advantageous Effects

According to the present disclosure, a small radio frequency module that includes a difference amplifying type power amplifier, and a communication device can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 6A is a schematic diagram illustrating a planar configuration of a radio frequency module according to Variation 6.

FIG. 7A is a schematic diagram illustrating a planar configuration of a radio frequency module according to Variation 7.

DESCRIPTION OF EMBODIMENTS

Figure 1:
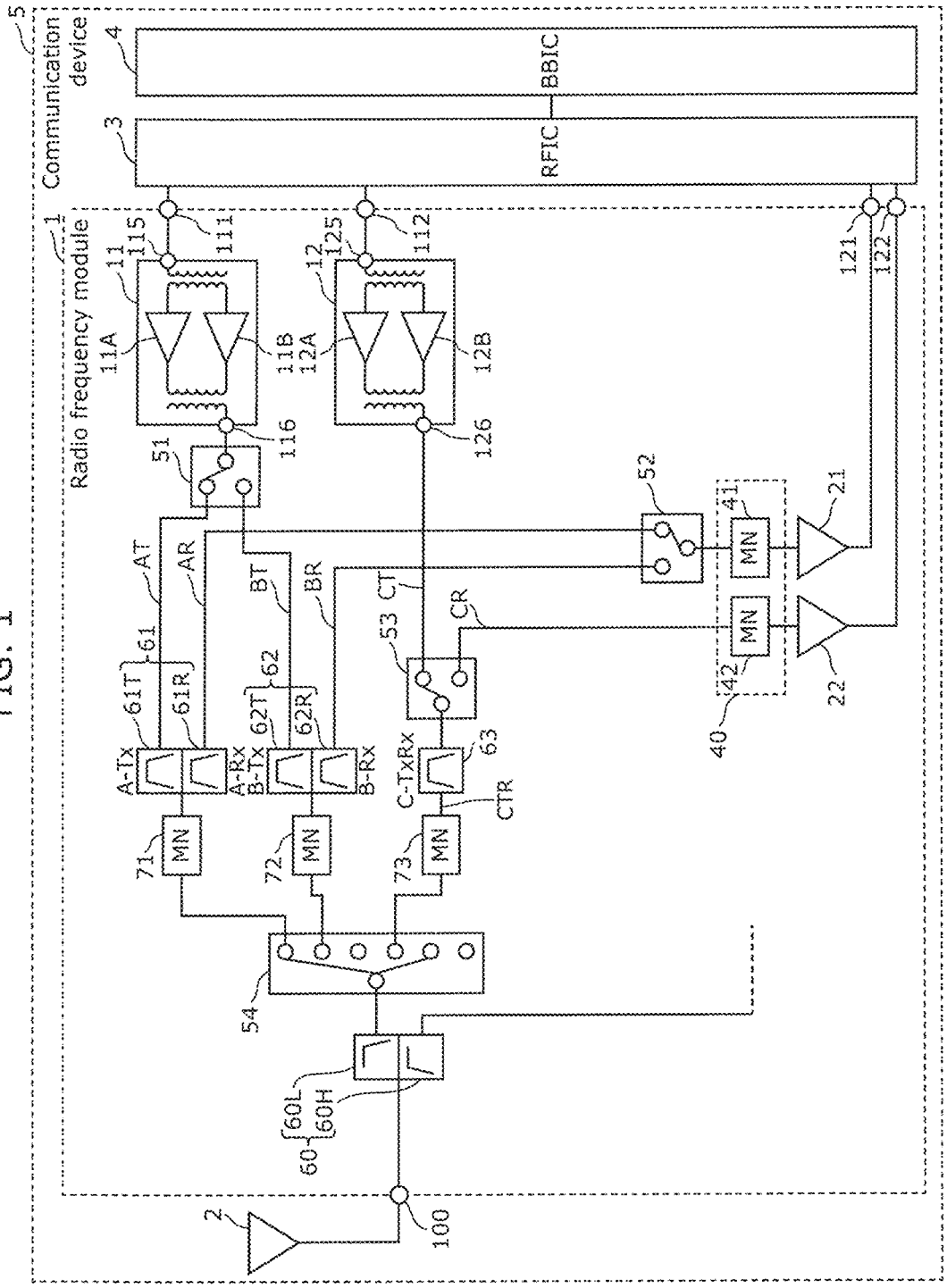
FIG. 1 illustrates a circuit configuration of a radio frequency module (or RF front-end circuitry) and a communication device according to an embodiment.

The following describes in detail embodiments of the present disclosure. Note that the embodiments described below each show a general or specific example. The numerical values, shapes, materials, elements, the arrangement and connection of the elements, and others indicated in the following embodiments are mere examples, and therefore are not intended to limit the present disclosure. Thus, among the elements in the following examples and variations, elements not recited in any independent claim are described as arbitrary elements. In addition, the sizes of elements and the ratios of the sizes illustrated in the drawings are not necessarily accurate. Throughout the drawings, the same numeral is given to substantially the same element, and redundant description may be omitted or simplified.

In the following, a term that indicates a relation between elements such as "parallel" or "perpendicular", a term that indicates the shape of an element such as "rectangular", and a numerical range do not necessarily have only strict meanings, and also have substantially equivalent meanings that include a difference of about several percent, for example.

In the following, regarding A, B, and C mounted on a board, "C is disposed between A and B in a plan view of a board (or a principal surface of a board)" means at least one of line segments that connect arbitrary points in A and B passes through a region of C in a plan view of a board. A plan view of a board means that a board and a circuit element mounted on the board are viewed, being orthogonally projected onto a plane parallel to a principle surface of the board.

In the following, a "transmission path" means a transfer route that includes, for instance, a line through which a radio frequency transmission signal propagates, an electrode directly connected to the line, and a terminal directly connected to the line or the electrode. Further, a "reception path" means a transfer route that includes, for instance, a line through which a radio frequency reception signal propagates, an electrode directly connected to the line, and a terminal directly connected to the line or the electrode. In addition, a "transmission and reception path" means a transfer route that includes, for instance, a line through which a radio frequency transmission signal and a radio frequency reception signal propagate, an electrode directly connected to the line, and a terminal directly connected to the line or the electrode. Furthermore, as used herein the terms "circuit" or "circuitry" means one or more circuits, including discrete circuit(s) as well as circuit board(s) and combinations thereof.

Embodiment

[1. Circuit Configuration of Radio Frequency Module 1 and Communication Device 5]

FIG. 1 illustrates a circuit configuration of radio frequency module 1 and communication device 5 according to an embodiment. As illustrated in FIG. 1, communication device 5 includes radio frequency module 1, antenna 2, radio frequency (RF) signal processing circuit (RF integrated circuit (RFIC)) 3, and baseband signal processing circuit (BB integrated circuit (BBIC)) 4. In this exemplary configuration the communication device is a multi-band transceiver. As used in this specification the term "module", as used with "radio frequency module", or "RF front-end module" should be construed as circuitry (programmable, as well as discrete) and associated circuit components, such as circuit boards, RF shielding, etc.

RFIC 3 is an RF signal processing circuit that processes radio frequency signals transmitted and received by antenna 2. Specifically, RFIC 3 processes a reception signal input through a reception path of radio frequency module 1 by down-conversion, for instance, and outputs a reception signal generated by being processed to BBIC 4. RFIC 3 processes a transmission signal input from BBIC 4 by up-conversion, for instance, and outputs a transmission signal generated by being processed to a transmission path of radio frequency module 1.

BBIC 4 is a circuit that processes signals using an intermediate frequency band lower than the frequency range of a radio frequency signal transferred in radio frequency module 1. A signal processed by BBIC 4 is used, for example, as an image signal for image display or as an audio signal for talk through a loudspeaker.

RFIC 3 also has a function as a controller that controls connection made by switches 51, 52, 53, and 54 included in radio frequency module 1, based on a communication band (a frequency band) to be used. Specifically, RFIC 3 changes connection made by switches 51 to 54 included in radio frequency module 1 according to a control signal (not illustrated). Note that the controller may be disposed outside RFIC 3, and may be disposed in radio frequency module 1 or BBIC 4, for example. Moreover, in one example the controller is a remote computer, or a distributed computer system that communicates with the radio frequency module 1 via a wireless or wired connection. Likewise, in another example, the controller is a local controller with a user interface that converts input signals into control commands that control the communication device 5 as well as subcomponents, such as the RF module 1.

Antenna 2 is connected to antenna connection terminal 100 of radio frequency module 1, radiates a radio frequency signal output from radio frequency module 1, and receives and outputs a radio frequency signal from the outside to radio frequency module 1.

Note that antenna 2 and BBIC 4 are not necessarily included in communication device 5 according to the present embodiment.

Next, a detailed configuration of radio frequency module 1 is to be described.

As illustrated in FIG. 1, radio frequency module 1 includes antenna connection terminal 100, power amplifiers 11 and 12, low noise amplifiers (LNAs) 21 and 22, transmission filters 61T and 62T, reception filters 61R and 62R, filter 63, reception input matching circuit 40, matching circuits 71, 72, and 73, switches 51, 52, 53, and 54, and diplexer 60.

Antenna connection terminal 100 is an example of an input/output terminal, and is an antenna common terminal connected to antenna 2.

Power amplifier 11 is a differential amplifier that amplifies radio frequency signals, input through transmission input terminal 111, of communication band A (a first communication band) and communication band B (a second communication band) that belong to a first frequency band group. Transmission power amplifier 12 is a differential amplifier that amplifies radio frequency signals, input through transmission input terminal 112, of communication band C that belongs to a second frequency band group having different frequency bands from the first frequency band group.

Low noise amplifier 21 amplifies radio frequency signals of communication band A and communication band B while maintaining noise low, and outputs the amplified signals to reception output terminal 121. Reception low noise amplifier 22 amplifies a radio frequency signal of communication band C while maintaining noise low, and outputs the amplified signal to reception output terminal 122.

Transmission filter 61T is disposed on transmission path AT that connects power amplifier 11 and antenna connection terminal 100, and passes a transmission signal of the transmission band of communication band A, within a transmission signal amplified by power amplifier 11. Transmission filter 62T is disposed on transmission path BT that connects power amplifier 11 and antenna connection terminal 100, and passes a transmission signal of the transmission band of communication band B, within a transmission signal amplified by power amplifier 11.

Reception filter 61R is disposed on reception path AR that connects low noise amplifier 21 and antenna connection terminal 100, and passes a reception signal of the reception band of communication band A, within a reception signal input through antenna connection terminal 100. Reception filter 62R is disposed on reception path BR that connects low noise amplifier 21 and antenna connection terminal 100, and passes a reception signal of the reception band of communication band B, within a reception signal input through antenna connection terminal 100.

Transmission filter 61T and reception filter 61R are included in duplexer 61 having a passband that is communication band A. Duplexer 61 transfers a transmission signal and a reception signal of communication band A, using the frequency division duplex (FDD) scheme. Transmission filter 62T and reception filter 62R are included in duplexer 62 having a passband that is communication band B. Duplexer 62 transfers a transmission signal and a reception signal of communication band B using the FDD scheme.

Note that duplexers 61 and 62 may each be a multiplexer that includes only a plurality of transmission filters, a multiplexer that includes only a plurality of reception filters, or a multiplexer that includes a plurality of duplexers.

Filter 63 is disposed on a path that connects switch 53 and switch 54, passes a transmission signal of communication band C within a transmission signal amplified by power amplifier 11, and passes a reception signal of communication band C within a reception signal input through antenna connection terminal 100. Filter 63 passes a transmission signal and a reception signal of communication band C using the time division duplex (TDD) scheme, according to switching operation of switch 53.

An end of transmission path AT is connected to transmission input terminal 111, and the other end of transmission path AT is connected to antenna connection terminal 100. An end of transmission path BT is connected to transmission input terminal 111, and the other end of transmission path BT is connected to antenna connection terminal 100. An end of transmission path CT is connected to transmission input terminal 112, and the other end of transmission path CT is connected to antenna connection terminal 100.

One end of reception path AR is connected to antenna connection terminal 100, and the other end of reception path AR is connected to reception output terminal 121. One end of reception path BR is connected to antenna connection terminal 100, and the other end of reception path BR is connected to reception output terminal 121. One end of reception path CR is connected to antenna connection terminal 100, and the other end of reception path CR is connected to reception output terminal 122.

An end of transmission and reception path CTR is connected to switch 53, and the other end of transmission and reception path CTR is connected to antenna connection terminal 100. Specifically, transmission and reception path CTR includes a portion of transmission path CT and a portion of reception path CR.

Reception input matching circuit 40 includes matching circuits 41 and 42. Matching circuit 41 is disposed on reception paths that connect low noise amplifier 21 to reception filters 61R and 62R, and matches the impedance between low noise amplifier 21 and reception filter 61R and the impedance between low noise amplifier 21 and reception filter 62R. Matching circuit 42 is disposed on a reception path that connects low noise amplifier 22 and filter 63, and matches the impedance between low noise amplifier 22 and filter 63.

Switch 51 includes a common terminal and two selection terminals. The common terminal of switch 51 is connected to output terminal 116 of power amplifier 11. One selection terminal out of the selection terminals of switch 51 is connected to transmission filter 61T, and the other selection terminal out of the selection terminals of switch 51 is connected to transmission filter 62T. This connection configuration allows switch 51 to switch between connecting the common terminal to the one selection terminal and connecting the common terminal to the other selection terminal. Specifically, switch 51 switches between connecting power amplifier 11 to transmission filter 61T and connecting transmission power amplifier 11 to transmission filter 62T. Switch 51 includes a single pole double throw (SPDT) switch circuit, for example.

Switch 52 includes a common terminal and two selection terminals. The common terminal of switch 52 is connected to an input terminal of low noise amplifier 21 via matching circuit 41. One selection terminal out of the selection terminals of switch 52 is connected to reception filter 61R, and the other selection terminal out of the selection terminals of switch 52 is connected to reception filter 62R. This connection configuration allows switch 52 to switch between connecting and disconnecting the common terminal to/from the one selection terminal, and connecting and disconnecting the common terminal to/from the other selection terminal. Specifically, switch 52 switches between connecting and disconnecting low noise amplifier 21 to/from reception filter 61R, and switches between connecting and disconnecting low noise amplifier 21 to/from reception filter 62R. Switch 52 includes an SPDT switch circuit, for example.

Switch 53 includes a common terminal and two selection terminals. The common terminal of switch 53 is connected to filter 63. One selection terminal out of the selection terminals of switch 53 is connected to output terminal 126 of power amplifier 12, and the other selection terminal out of the selection terminals of switch 53 is connected to an input terminal of low noise amplifier 22 via matching circuit 42. This connection configuration allows switch 53 to switch between connecting and disconnecting the common terminal to/from the one selection terminal, and connecting and disconnecting the common terminal to/from the other selection terminal. Specifically, switch 53 switches between connecting and disconnecting filter 63 to/from power amplifier 12, and switches between connecting and disconnecting filter 63 to/from low noise amplifier 22. Switch 53 includes an SPDT switch circuit, for example.

Switch 54 is an example of an antenna switch, is connected to antenna connection terminal 100 via diplexer 60, and switches among (1) connecting antenna connection terminal 100 to transmission path AT and reception path AR, (2) connecting antenna connection terminal 100 to transmission path BT and reception path BR, and (3) connecting antenna connection terminal 100 to transmission and reception path CTR. Note that switch 54 includes a multiple connection switch circuit that allows two or more simultaneous connections of (1) to (3) above.

Matching circuit 71 is disposed on a path that connects switch 54 and duplexer 61, and matches the impedance between (i) duplexer 61 and (ii) antenna 2 and switch 54. Matching circuit 72 is disposed on a path that connects switch 54 and duplexer 62, and matches the impedance between (i) duplexer 62 and (ii) antenna 2 and switch 54. Matching circuit 73 is disposed on a path that connects switch 54 and filter 63, and matches the impedance between (i) filter 63 and (ii) antenna 2 and switch 54.

Diplexer 60 is an example of a multiplexer, and includes filters 60L and 60H. Filter 60L has a passband whose frequency range includes the first frequency band group and the second frequency band group, and filter 60H has a passband whose frequency range includes another frequency band group having different frequency bands from the first frequency band group and the second frequency band group. One terminal of filter 60L and one terminal of filter 60H are connected in common to antenna connection terminal 100. Filters 60L and 60H are each an LC filter that includes at least one of a chip inductor or a chip capacitor, for example. Note that when the first frequency band group and the second frequency band group have lower frequency bands than the other frequency band group, filter 60L may be a lowpass filter, and filter 60H may be a highpass filter.

Note that transmission filters 611 and 621 and reception filters 61R, 62R, and 63 described above may each be one of, for example, an acoustic wave filter that uses surface acoustic waves (SAWS), an acoustic wave filter that uses bulk acoustic waves (BAWs), an LC resonance filter, and a dielectric filter, and furthermore, are not limited to those filters.

Matching circuits 41, 42, and 71 to 73 are elements that are not necessarily included in the radio frequency module according to the present disclosure.

In the configuration of radio frequency module 1, power amplifier 11, switch 51, transmission filter 61T, matching circuit 71, switch 54, and filter 60L are included in a first transmission circuit that transfers a transmission signal of communication band A towards antenna connection terminal 100. Filter 60L, switch 54, matching circuit 71, reception filter 61R, switch 52, matching circuit 41, and low noise amplifier 21 are included in a first reception circuit that transfers a reception signal of communication band A from antenna 2 via antenna connection terminal 100.

Power amplifier 11, switch 51, transmission filter 62T, matching circuit 72, switch 54, and filter 60L are included in a second transmission circuit that transfers a transmission signal of communication band B towards antenna connection terminal 100. Filter 60L, switch 54, matching circuit 72, reception filter 62R, switch 52, matching circuit 41, and low noise amplifier 21 are included in a second reception circuit that transfers a reception signal of communication band B from antenna 2 via antenna connection terminal 100.

Power amplifier 12, switch 53, filter 63, matching circuit 73, switch 54, and filter 60L are included in a third transmission circuit that transfers a transmission signal of communication band C towards antenna connection terminal 100. Filter 60L, switch 54, matching circuit 73, filter 63, switch 53, matching circuit 42, and low noise amplifier 22 are included in a third reception circuit that transfers a reception signal of communication band C from antenna 2 via antenna connection terminal 100.

According to the above circuit configuration, radio frequency module 1 can carry out at least one of simultaneous transmission, simultaneous reception, or simultaneous transmission and reception of a radio frequency signal of communication band A or B and a radio frequency signal of communication band C.

Note that in the radio frequency module according to the present disclosure, the three transmission circuits and the three reception circuits may not be connected to antenna connection terminal 100 via switch 54, and may be connected to antenna 2 via different terminals. The radio frequency module according to the present disclosure may include at least one of the first transmission circuit, the second transmission circuit, or the third transmission circuit.

In the radio frequency module according to the present disclosure, the first transmission circuit may include at least one of power amplifier 11, transmission filter 61T, switch 54, or filter 60L. The second transmission circuit may include at least one of power amplifier 11, transmission filter 62T, switch 54, or filter 60L. The third transmission circuit may include at least one of power amplifier 12, filter 63, switch 54, or filter 60L.

Reception low noise amplifiers 21 and 22 and switches 51 to 54 may be formed into one semiconductor integrated circuit (IC). Furthermore, the semiconductor IC may also include transmission power amplifiers 11 and 12. The semiconductor IC includes a complementary metal oxide semiconductor (CMOS), for example. Specifically, the semiconductor IC is formed by the silicon on insulator (SOI) process. Accordingly, the semiconductor IC can be manufactured at a low cost. Note that the semiconductor IC may include at least one of GaAs, SiGe, or GaN. Thus, a radio frequency signal having high amplification quality and high noise quality can be output.

Here, the circuit configuration of power amplifiers 11 and 12 is to be described in detail.

Figure 2:
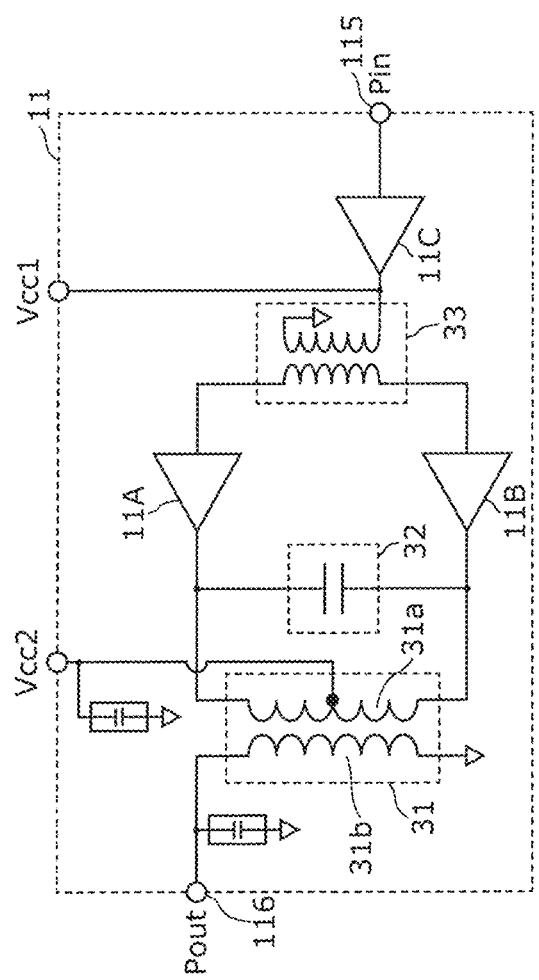
FIG. 2 illustrates a circuit configuration of a difference amplifying type power amplifier.

FIG. 2 illustrates a circuit configuration of power amplifier 11. As illustrated in FIG. 2, power amplifier 11 includes input terminal 115, output terminal 116, amplifying element 11A (a first amplifying circuit element), amplifying element 116 (a second amplifying circuit element), amplifying element 11C, output transformer (transformer) 31, capacitor 32, and interstage transformer (unbalance-balance transforming element) 33.

An input terminal of amplifying element 11C is connected to input terminal 115, and an output terminal of amplifying element 11C is connected to an unbalance terminal of interstage transformer 33. One balance terminal of interstage transformer 33 is connected to an input terminal of amplifying element 11A, and the other balance terminal of interstage transformer 33 is connected to an input terminal of amplifying element 11B.

A radio frequency signal input through input terminal 115 is amplified by amplifying element 11C in a state in which bias voltage Vcc1 is applied to amplifying element 11C. Interstage transformer applies unbalance-balance transform to the amplified radio frequency signal. At this time, a non-inverted input signal is output through the one balance terminal of interstage transformer 33, and an inverted input signal is output through the other balance terminal of interstage transformer 33.

Output transformer 31 includes primary coil 31a (a first coil) and secondary coil 31b (a second coil). An end of primary coil 31a is connected to an output terminal of amplifying element 11A, and the other end of primary coil 31a is connected to an output terminal of amplifying element 11B. Bias voltage Vcc2 is supplied to the middle point of primary coil 31a. An end of secondary coil 31b is connected to output terminal 116, and the other end of secondary coil 31b is connected to the ground. In other words, output transformer 31 is connected between output terminal 116 and the output terminals of amplifying elements 11A and 11B.

Capacitor 32 is connected between the output terminal of amplifying element 11A and the output terminal of amplifying element 11B.

Impedance of a non-inverted input signal amplified by amplifying element 11A and impedance of an inverted input signal amplified by amplifying element 11B are transformed by output transformer 31 and capacitor 32, being in antiphase each other. Specifically, output transformer 31 and capacitor 32 matches output impedance of power amplifier 11 at output terminal 116 to input impedance of switch 51 and transmission filters 61T and 62T illustrated in FIG. 1. Note that a capacitive element connected between the ground and a path that connects output terminal 116 and secondary coil 31b contributes to the impedance matching. Note that the capacitive element may be disposed in series on the path that connects output terminal 116 and secondary coil 31b, or may not be included.

According to the circuit configuration of power amplifier 11, amplifying elements 11A and 11B operate in antiphase with each other. At this time, fundamental-wave currents flow through amplifying elements 11A and 11B in antiphase with each other, that is, in opposite directions, and thus fundamental-wave currents do not flow into a ground line and a power supply line disposed at a substantially equal distance from amplifying elements 11A and 11B. Accordingly, inflow of unnecessary currents to the above lines can be disregarded, and thus decrease in power gain that can be seen in a conventional power amplifier can be reduced. Further, a noninverted signal and an inverted signal amplified by amplifying elements 11A and 11B are combined, and thus noise components superimposed similarly on the signals can be cancelled out, and unnecessary waves such as harmonic components, for example, can be decreased.

Note that amplifying element 11C is not necessarily included in power amplifier 11. A component that transforms an unbalanced input signal into a non-inverted input signal and an inverted input signal is not limited to interstage transformer 33. Capacitor 32 is not an essential element for impedance matching.

Amplifying elements 11A, 11B, and 11C and low noise amplifiers 21 and 22 each include a field effect transistor (FET) or a hetero-bipolar transistor (HBT) made of a Si-based CMOS or GaAs, for example.

Note that power amplifier 12 includes input terminal 125, output terminal 126, amplifying elements 12A and 12B, amplifying element 12C, output transformer 36, capacitor 37, and interstage transformer 38, and has a circuit configuration the same as the circuit configuration of power amplifier 11 illustrated in FIG. 2.

Here, when radio frequency module 1 is mounted on a single mounting substrate, many circuit elements are included in power amplifiers 11 and 12 (such as amplifying elements 11A to 11C and 12A to 12C, interstage transformers 33 and 38, output transformers 31 and 36, and capacitors 32 and 37), and thus the size of radio frequency module 1 is increased. If the elements are mounted densely for size reduction, a high-power transmission signal output from power amplifier 11 or 12 is coupled with at least one of the circuit components included in radio frequency module 1 via a magnetic field, an electric field, or an electromagnetic field, or high-power transmission signals output from power amplifiers 11 and 12 are coupled via a magnetic field, an electric field, or an electromagnetic field, which leads to a problem that transfer loss of a radio frequency signal transferred in radio frequency module 1 increases.

To address this, radio frequency module 1 according to the present embodiment has a configuration that reduces the size of radio frequency module 1 while preventing power amplifiers 11 and 12 and other circuit components from being coupled with one another via an electric field, a magnetic field, or an electromagnetic field. The following describes a configuration of radio frequency module 1 that archives both preventing coupling via an electric field, a magnetic field, or an electromagnetic field, and reducing the size thereof.

[2. Arrangement of Circuit Elements of Radio Frequency Module 1A According to Example]

Figure 3A:
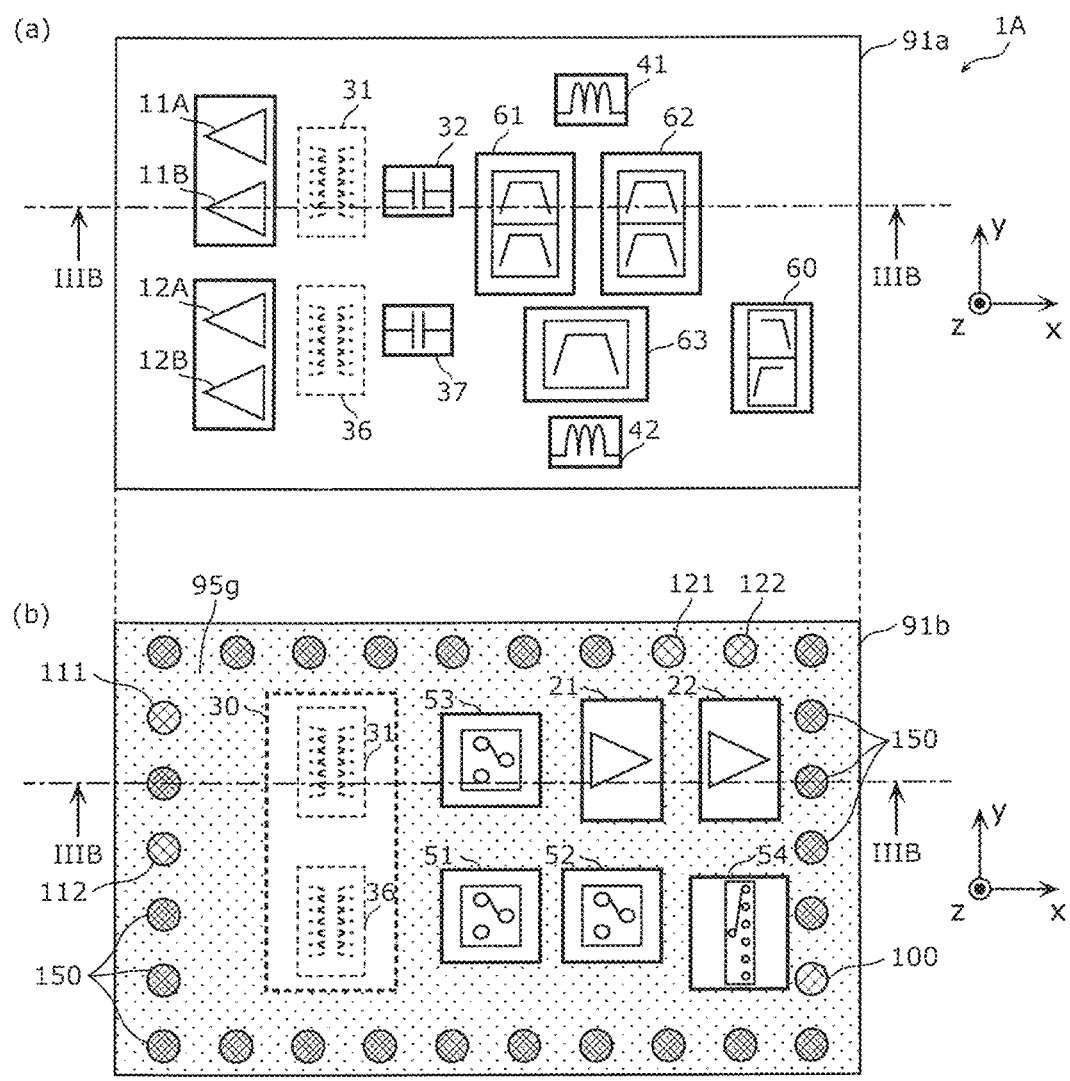
FIG. 3A is a schematic diagram illustrating a planar configuration of a radio frequency module according to an example.
Figure 3B:
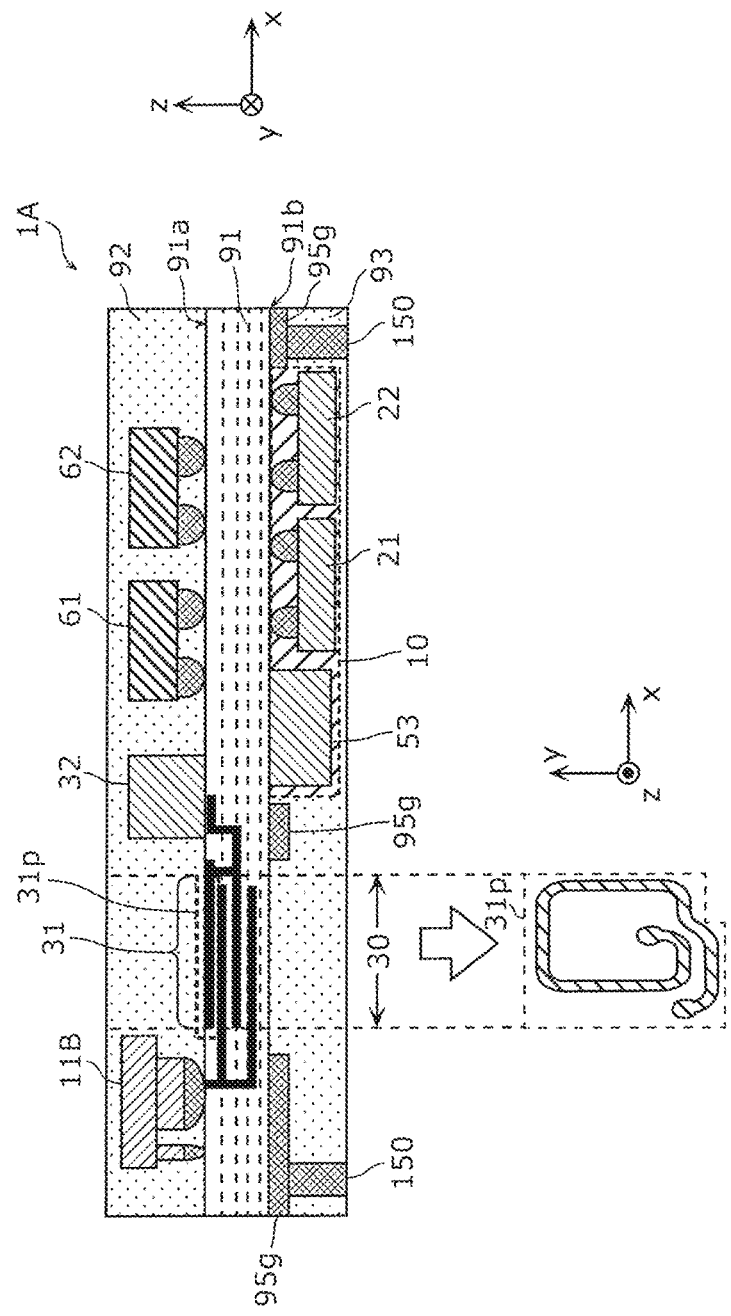
FIG. 3B is a schematic diagram illustrating a cross-sectional configuration of the radio frequency module according to the example.

FIG. 3A is a schematic diagram illustrating a planar configuration of radio frequency module 1A according to an example. FIG. 3B is a schematic diagram illustrating a cross-sectional configuration of radio frequency module 1A according to the example and specifically, illustrates a cross section taken along line IIIB to IIIB in FIG. 3A. Note that (a) of FIG. 3A illustrates a layout of circuit elements when principal surface 91a out of principal surfaces 91a and 91b on opposite sides of module board 91 is viewed from the positive z-axis. On the other hand, (b) of FIG. 3A is a perspective view of the layout of circuit elements when principal surface 91b is viewed from the positive z-axis. FIG. 3A illustrates output transformers 31 and 36 formed (or disposed) inside of module board 91 indicated with dashed lines.

Radio frequency module 1A according to the example shows a specific arrangement of circuit elements included in radio frequency module 1 according to the embodiment.

As illustrated in FIGS. 3A and 3B, radio frequency module 1A according to this example further includes module board 91 and resin members 92 and 93, in addition to the circuit configuration illustrated in FIG. 1.

Module board 91 is a board which includes principal surface 91a (a first principal surface) and principal surface 91b (a second principal surface) on opposite sides of module board 91, and on which the above transmission circuits and the above reception circuits are mounted. As module board 91, one of a low temperature co-fired ceramics (LTCC) board, a high temperature co-fired ceramics (HTCC) board, a component-embedded board, a board that includes a redistribution layer (RDL), and a printed circuit board, each having a stacked structure of a plurality of dielectric layers, is used, for example. Note that on module board 91, antenna connection terminal 100, transmission input terminals 111 and 112, reception output terminals 121 and 122, input terminals 115 and 125, and output terminals 116 and 126 may be formed.

Resin member 92 is disposed on principal surface 91a of module board 91, covers at least partially the transmission circuits, at least partially the reception circuits, and principal surface 91a of module board 91, and has a function of ensuring reliability of mechanical strength and moisture resistance, for instance, of the circuit elements included in the transmission circuits and the reception circuits. Resin member 93 is disposed on principal surface 91b of module board 91, covers at least partially the transmission circuits, at least partially the reception circuits, and principal surface 91b of module board 91, and has a function of ensuring reliability of mechanical strength and moisture resistance, for instance, of the circuit elements included in the transmission circuits and the reception circuits. Note that resin members 92 and 93 are elements not necessarily included in the radio frequency module according to the present disclosure.

As illustrated in FIGS. 3A and 3B, in radio frequency module 1A according to this example, amplifying elements 11A, 11B, 12A, and 12B, capacitors 32 and 37, duplexers 61 and 62, filter 63, matching circuits 41 and 42, and diplexer 60 are mounted on principal surface 91a of module board 91. On the other hand, low noise amplifiers 21 and 22 and switches 51, 52, 53, and 54 are mounted on principal surface 91b of module board 91. Output transformers 31 and 36 are formed inside of module board 91. Note that although not illustrated in FIGS. 3A and 3B, matching circuits 71 to 73 and interstage transformers 33 and 38 may be mounted on either of principal surfaces 91a and 91b of module board 91, or may be provided inside of module board 91.

Note that although not illustrated in FIG. 3A, lines that constitute transmission paths AT, BT, and CT and reception paths AR, BR, and CR illustrated in FIG. 1 are formed inside of module board 91 and on principal surfaces 91a and 91b. The above lines may be bonding wires having ends joined to any of principal surfaces 91a and 91b and circuit elements included in radio frequency module 1A, or may be terminals, electrodes, or lines formed on the surfaces of circuit elements included in radio frequency module 1A.

In this example, low noise amplifiers 21 and 22 and switches 51, 52, 53, and 54 are first circuit components, and disposed on principal surface 91b. On the other hand, amplifying elements 11A, 11B, 12A, and 12B are disposed on principal surface 91a.

According to the above configuration, amplifying elements 11A, 11B, 12A, and 12B and the first circuit components are disposed on two sides of module board 91, with module board 91 therebetween. Accordingly, radio frequency module 1 can be miniaturized as compared with a configuration in which all amplifying elements 11A, 11B, 12A, and 12B and the first circuit components are disposed on one side of module board 91. Amplifying elements 11A, 11B, 12A, and 12B and the first circuit components are disposed with module board 91 therebetween, and thus transmission signals output from amplifying elements 11A, 11B, 12A, and 12B can be prevented from being coupled with the first circuit components via an electric field, a magnetic field, or an electromagnetic field. Accordingly, small radio frequency module 1 in which transfer loss of the transmission signals is decreased can be provided.

Further, transmission signals output from amplifying elements 11A, 11B, 12A, and 12B can be prevented from being coupled with the first circuit components via an electric field, a magnetic field, or an electromagnetic field, and thus a transmission signal of communication band A, B, or C can be prevented from flowing into one or more of reception paths AR, BR, and CR without passing through transmission filter 61T or 62T and switch 54, for example. Further, harmonics that occur from amplifying elements 11A, 11B, 12A, and 12B and moreover, spurious waves due to intermodulation distortion caused by a transmission signal amplified by transmission power amplifier 11 and a transmission signal amplified by transmission power amplifier 12 can be prevented from sneaking into one or more of reception paths AR, BR, and CR. Accordingly, isolation of the transmission circuits from the reception circuits improves, and thus this can reduce a decrease in reception sensitivity caused by the transmission signal, harmonics, and spurious waves due to intermodulation distortion sneaking into the reception paths.

Note that in radio frequency module 1A according to this example, low noise amplifiers 21 and 22 and switches 51 to 54 may be formed in one semiconductor IC 10.

Although radio frequency module 1A according to this example has a configuration in which low noise amplifiers 21 and 22 and switches 51, 52, 53, and 54 are disposed on principal surface 91b, yet amplifying elements 11A, 116, 12A, and 126 may be disposed on principal surface 91a, and at least one of the first circuit components may be disposed on principal surface 91b. For example, when at least one of switches 51, 52, 53, and 54 is a first circuit component, low noise amplifiers 21 and 22 may be disposed on principal surface 91a.

Accordingly, smaller radio frequency module 1 in which transfer loss of the above transmission signals is decreased can be provided, as compared with a radio frequency module having a configuration in which amplifying elements 11A, 11B, 12A, and 12B and all the first circuit components are disposed on the same principal surface.

The first circuit component may be at least one of:
(1) low noise amplifier 21 or 22
(2) an inductor of matching circuit 41 or an inductor of matching circuit 42
(3) one of switches 51 to 54
(4) one of transmission filters 61T and 62T, reception filters 61R and 62R, and filter 63
(5) diplexer 60
(6) capacitor 32 or 37

Note that desirably, module board 91 has a multilayer structure in which a plurality of dielectric layers are stacked, and a ground electrode pattern is formed on at least one of the dielectric layers. Accordingly, the electromagnetic field shielding function of module board 91 improves.

Among the circuit components shown in (1) to (6) above, a first circuit component on module board 91 on another side of which amplifying elements 11A, 11B, 12A, and 12B are disposed may be disposed on reception path AR, BR, or CR. Specifically, the first circuit component may be any of (1) low noise amplifier 21 or 22, (2) the inductor of matching circuit 41 or the inductor of matching circuit 42, (3) switch 53 or 54, (4) one of reception filters 61R and 62R and filter 63, and (5) diplexer 60. In this case, desirably, the first circuit components disposed on principal surface 91b and output transformers 31 and 36 do not overlap in a plan view of module board 91, as illustrated in FIG. 3A.

Accordingly, transmission signals output from amplifying elements 11A, 11B, 12A, and 12B, and transferred through output transformers 31 and 36 can be effectively prevented from being coupled with the first circuit components disposed on the reception paths via a magnetic field or an electromagnetic field. Accordingly, isolation of power amplifiers 11 and 12 from the reception circuits improves, and thus the transmission signals, harmonics, and spurious waves due to intermodulation distortion can be effectively prevented from sneaking into the reception paths, thus reducing a decrease in reception sensitivity.

Among the circuit components indicated in (1) to (6) above, a first circuit component on module board 91 on another side of which amplifying elements 11A, 11B, 12A, and 12B are disposed is more desirably (1) low noise amplifier 21 or 22. In this case, desirably, low noise amplifiers 21 and 22 disposed on principal surface 91b and output transformers 31 and 36 do not overlap in a plan view of module board 91, as illustrated in FIG. 3A.

Accordingly, transmission signals output from amplifying elements 11A, 11B, 12A, and 12B, and transferred through output transformers 31 and 36 can be prevented from being coupled with one or both of low noise amplifiers 21 and 22 via a magnetic field or an electromagnetic field. Thus, isolation of power amplifiers 11 and 12 from the one or both of low noise amplifiers 21 and 22 improves, and thus the transmission signals, harmonics, and spurious waves due to intermodulation distortion can be still further prevented from sneaking into the reception paths, thus reducing a decrease in reception sensitivity.

In radio frequency module 1A according to this example, in a plan view of module board 91, amplifying elements 11A and 11B and output transformer 31 do not overlap, and amplifying elements 12A and 12B and output transformer 36 do not overlap, desirably, as illustrated in FIG. 3A.

Accordingly, amplifying elements 11A and 11B and secondary coil 31b of output transformer 31 can be prevented from being unnecessarily coupled with one another via a magnetic field or an electromagnetic field, and amplifying elements 12A and 12B and secondary coil 36b of output transformer 36 can be prevented from being unnecessarily coupled with one another via a magnetic field or an electromagnetic field. Consequently, the degree of impedance matching between power amplifiers 11 and 12 can be prevented from decreasing, thus reducing an increase in transfer loss and an increase in spurious waves.

In radio frequency module 1A according to this example, a plurality of external-connection terminals 150 are disposed on principal surface 91b of module board 91. Radio frequency module 1A exchanges electrical signals with the motherboard disposed on the negative z-axis side of radio frequency module 1A, via external-connection terminals 150. Potential of some of external-connection terminals 150 are set to the ground potential of the motherboard. On principal surface 91b facing the motherboard out of principal surfaces 91a and 91b, power amplifiers 11 and 12 whose height is not readily decreased are not disposed, and low noise amplifiers 21 and 22 and switches 51 to 54 whose height is readily decreased are disposed, and thus the height of radio frequency module 1A as a whole can be decreased. Further, external-connection terminals 150 used as ground electrodes are disposed around low noise amplifiers 21 and 22 that greatly affect reception sensitivity of the reception circuits, and thus deterioration of reception sensitivity of the reception circuits can be reduced.

Figure 3C:
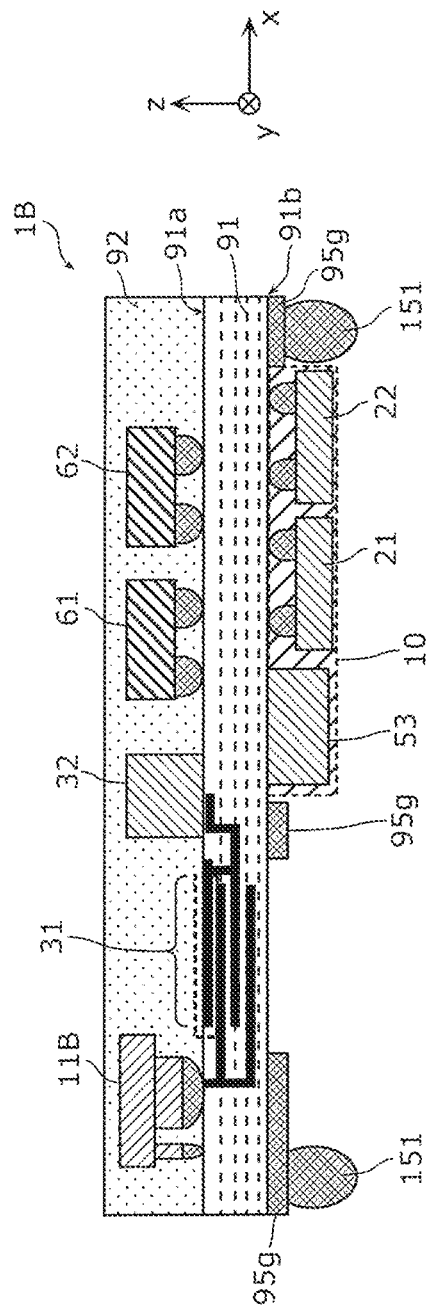
FIG. 3C is a schematic diagram illustrating a cross-sectional configuration of a radio frequency module according to Variation 1.

Note that external-connection terminals 150 may be columnar electrodes passing through resin member 93 in the z-axis direction as illustrated in FIGS. 3A and 3B, or may be bump electrodes 151 formed on principal surface 91b as in radio frequency module 1B according to Variation 1 illustrated in FIG. 3C. In this case, resin member 93 may not be provided on principal surface 91b.

Power amplifiers 11 and 12 are components that generate a great amount of heat, out of circuit components included in radio frequency module 1A. In order to improve heat dissipation of radio frequency module 1A, it is important to dissipate heat generated by power amplifiers 11 and 12 to the motherboard through heat dissipation paths having low heat resistance. If power amplifiers 11 and 12 are mounted on principal surface 91b, electrode lines connected to power amplifiers 11 and 12 are disposed on principal surface 91b. Accordingly, the heat dissipation paths include a heat dissipation path along only a planar line pattern (in the icy plane direction) on principal surface 91b. The planar line pattern is formed of a thin metal film, and thus has high heat resistance. Accordingly, if power amplifiers 11 and 12 are disposed on principal surface 91b, heat dissipation deteriorates.

In contrast, if power amplifiers 11 and 12 are mounted on principal surface 91a as in this example, power amplifiers 11 and 12 and external-connection terminals 150 can be connected via penetrating electrodes passing through module board 91 between principal surface 91a and principal surface 91b. Accordingly, as heat dissipation paths for power amplifiers 11 and 12, a heat dissipation path extending along only a planar line pattern in the xy plane direction and having high heat resistance can be excluded from lines on and in module board 91. Thus, miniaturized radio frequency module 1A having improved heat dissipation from transmission power amplifiers 11 and 12 to the motherboard can be provided.

According to the above configuration that improves heat dissipation of radio frequency module 1A, penetrating electrodes and external-connection terminals, for instance, intended to dissipate heat are disposed in the region in positions opposite transmission power amplifiers 11 and 12 in the z-axis direction, and thus it is desirable not to dispose circuit components. Also from this viewpoint, it is desirable that amplifying elements 11A and 11B and output transformer 31 do not overlap, and amplifying elements 12A and 12B and output transformer 36 do not overlap, in a plan view of module board 91.

Note that output transformers 31 and 36 are formed inside of module board 91 between principal surface 91a and principal surface 91b in radio frequency module 1A according to this example. According to this, it is not necessary to dispose output transformers 31 and 36 on principal surface 91a or principal surface 91b, and thus the area for radio frequency module 1A can be reduced. Note that in output transformer 31 formed inside of module board 91, for example, primary coil 31a and secondary coil 31b are each formed in planar line pattern 31p in the xy plane direction. Primary coil 31a and secondary coil 31b each formed in planar line pattern 31p face each other within the xy plane or are disposed in opposite positions in the z-axis direction, so as to have predetermined magnetic coupling.

In radio frequency module 1A according to this example, as illustrated in FIGS. 3A and 3B, module board 91 includes ground electrode layer 95g formed on principal surface 91b in a direction parallel to the direction of the xy plane. Here, in a plan view of module board 91, desirably, ground electrode layer 95g is not formed in regions on both principal surfaces 91a and 91b, which overlap formation region 30 in which output transformers 31 and 36 are formed.

According to this, it can be ensured that output transformers 31 and 36 and a ground electrode are widely spaced apart, and thus transfer loss of transmission signals transferred through power amplifiers 11 and 12 can be decreased.

Note that in this example, in a plan view of module board 91, ground electrode layer 95g is not formed in regions on both principal surfaces 91a and 91b, which overlap formation region 30 in which output transformers 31 and 36 are formed, but a configuration in which ground electrode layer 95g is not formed in a region on one of principal surface 91a and principal surface 91b, which overlaps formation region 30 in which output transformers 31 and 36 are formed, may be adopted. Even in this case, transfer loss of transmission signals transferred through power amplifiers 11 and 12 can be decreased.

As illustrated in FIGS. 3A and 3B, in a plan view of module board 91, it is desirable that no circuit component is disposed in a region in principal surface 91a or a region in principal surface 91b, which overlaps the formation region in which output transformers 31 and 36 are formed.

Output transformers 31 and 36 transfer high-power transmission signals amplified by power amplifiers 11 and 12, respectively, and thus Q factors of inductors included in output transformers 31 and 36 are desirably high. If one or more circuit components are in a region that overlaps output transformers 31 and 36 in the above plan view, electromagnetic fields formed by the inductors are influenced by the one or more circuit components, and the Q factors of the inductors decrease, and power of transmission signals output from output transformers 31 and 36 decreases. To address this, the above configuration can reduce a decrease in amplification performance of power amplifiers 11 and 12.

Note that in this example, output transformers 31 and 36 are formed inside of module board 91 between principal surface 91a and principal surface 91b and offset toward principal surface 91a. In this case, in a plan view of module board 91, no circuit component is disposed in a region in principal surface 91a that overlaps the formation region in which output transformers 31 and 36 are formed, and one or more circuit components (not illustrated) may be disposed in a region in principal surface 91b that overlaps the formation region in which output transformers 31 and 36 are formed.

Even in this case, no circuit component is disposed in the above region in principal surface 91a closer to output transformers 31 and 36, and thus decreases in the Q factors of the inductors of output transformers 31 and 36 can be reduced.

Figure 4A:
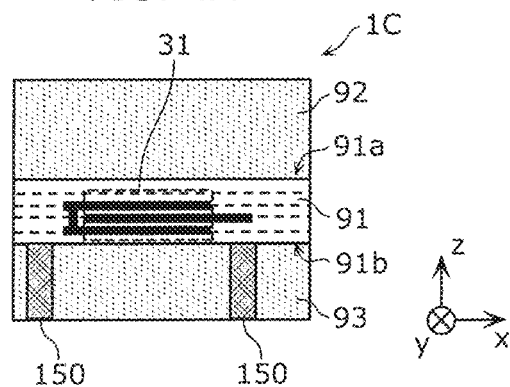
FIG. 4A is a schematic diagram illustrating a cross-sectional configuration of an output transformer according to Variation 2.

FIG. 4A is a schematic diagram of a cross-sectional configuration illustrating the position of output transformer 31 in radio frequency module 1C according to Variation 2. FIG. 4A illustrates the position of output transformer 31 in the cross-sectional configuration of radio frequency module 1C according to Variation 2. Note that the arrangement of circuit components other than output transformer 31 included in radio frequency module 1C is the same as radio frequency module 1A according to the example. In radio frequency module 1C, output transformer 31 is formed inside of module board 91 between principal surface 91a and principal surface 91b and offset toward principal surface 91b. In this case, in a plan view of module board 91, no circuit component is disposed in a region in principal surface 91b that overlaps the formation region in which output transformer 31 is formed, and one or more circuit components (not illustrated) may be disposed in a region in principal surface 91a that overlaps the formation region in which output transformer 31 is formed.

Even in this case, no circuit component is disposed in the above region in principal surface 91b that is closer to output transformer 31, and thus a decrease in the Q factor of the inductor of output transformer 31 can be reduced.

Figure 4B:
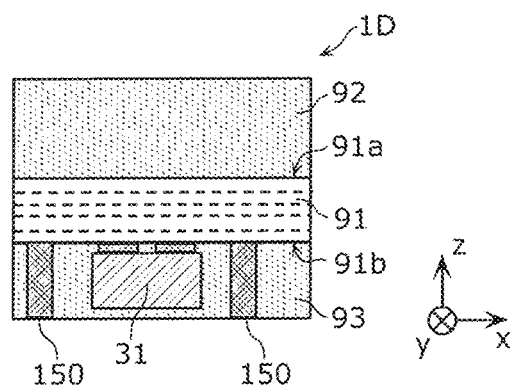
FIG. 4B is a schematic diagram illustrating a cross-sectional configuration of the output transformer according to Variation 3.

FIG. 4B is a schematic diagram of a cross-sectional configuration illustrating the position of output transformer 31 in radio frequency module 1D according to Variation 3. FIG. 4B illustrates the position of output transformer 31 in the cross-sectional configuration of radio frequency module 1D according to Variation 3. Note that the arrangement of circuit components other than output transformer 31 included in radio frequency module 1D is the same as radio frequency module 1A according to the example. In radio frequency module 1D, output transformer 31 is disposed on principal surface 91b. Output transformer 31 is a chip inductor or capacitor, for example. In this case, desirably, no circuit component is disposed in a region in principal surface 91a that overlaps the formation region in which output transformer 31 is formed, in a plan view of module board 91.

According to this configuration, no circuit component is disposed in the above region in principal surface 91a, and thus a decrease in the Q factor of the inductor of output transformer 31 can be reduced.

Figure 4C:
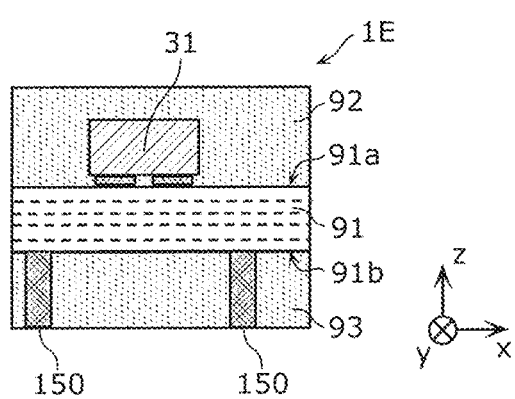
FIG. 4C is a schematic diagram illustrating a cross-sectional configuration of the output transformer according to Variation 4.

FIG. 4C is a schematic diagram of a cross-sectional configuration illustrating the position of output transformer 31 in radio frequency module 1E according to Variation 4. FIG. 4C illustrates the position of output transformer 31 in the cross-sectional configuration of radio frequency module 1E according to Variation 4. Note that the arrangement of circuit components other than output transformer 31 included in radio frequency module 1E is the same as radio frequency module 1A according to the example. In radio frequency module 1E, output transformer 31 is disposed on principal surface 91a. Output transformer 31 is a chip inductor or capacitor, for example. In this case, desirably, no circuit component is disposed in a region of principal surface 91b that overlaps a formation region in which output transformer 31 is formed, in a plan view of module board 91.

According to this configuration, no circuit component is disposed in the above area in principal surface 91b, and thus a decrease in the Q factor of the inductor of output transformer 31 can be reduced.

Note that the formation region in which output transformer 31 is formed is defined as follows. The formation region in which output transformer 31 is formed is a minimum region that includes a formation region in which a primary coil is formed and a formation region in which a secondary coil is formed, in a plan view of module board 91.

Note that formation region 30 in which output transformer 31 is formed is defined as follows. Formation region 30 in which output transformer 31 is formed is a minimum region that includes a formation region in which primary coil 31a is formed and a formation region in which secondary coil 31b is formed, in a plan view of module board 91.

Here, secondary coil 31b is defined as a line conductor disposed along primary coil 31a, in a section in which a first distance from primary coil 31a is substantially constant. At this time, portions of the line conductor located on both sides of the above section are spaced apart from primary coil 31a by a second distance longer than the first distance, and one end and the other end of secondary coil 31b are points at which a distance from the line conductor to primary coil 31a changes from the first distance to the second distance. Primary coil 31a is defined as a line conductor disposed along secondary coil 31b, in a section in which the first distance from secondary coil 31b is substantially constant. At this time, portions of the line conductor located on both sides of the above section are spaced apart from secondary coil 31b by the second distance longer than the first distance, and one end and the other end of primary coil 31a are points at which a distance from the line conductor to secondary coil 31b changes from the first distance to the second distance.

Alternatively, secondary coil 31b is defined as a line conductor disposed along primary coil 31a, in a first section in which the line width is a substantially constant first width. Primary coil 31a is defined as a line conductor disposed along secondary coil 31b, in the first section in which the line width is the substantially constant first width.

Alternatively, secondary coil 31b is defined as a line conductor disposed along primary coil 31a, in a first section in which the thickness is a substantially constant first thickness. Primary coil 31a is defined as a line conductor disposed along secondary coil 31b, in the first section in which the thickness is the substantially constant first thickness.

Alternatively, secondary coil 31b is defined as a line conductor disposed along primary coil 31a, in a first section in which a degree of coupling with primary coil 31a is a substantially constant first degree of coupling. Further, primary coil 31a is defined as a line conductor disposed along secondary coil 31b, in the first section in which a degree of coupling with secondary coil 31b is a substantially constant first degree of coupling.

In radio frequency module 1A according to this example, switch 51 is disposed on principal surface 91b, and duplexers 61 and 62 are disposed on principal surface 91a, as illustrated in FIG. 3A.

According to this, switch 51 and duplexers 61 and 62 are disposed with module board 91 therebetween, and thus a high-power transmission signal that passes through switch 51 can be prevented from flowing into reception filters 61R and 62R without passing through transmission filters 61T and 621. Accordingly, deterioration of reception sensitivity in reception paths AR and BR can be reduced.

In radio frequency module 1A according to this example, duplexers 61 and 62 are disposed on principal surface 91a, and low noise amplifier 21 is disposed on principal surface 91b, as illustrated in FIGS. 3A and 3B. In a plan view of module board 91, duplexers 61 and 62 and low noise amplifier 21 at least partially overlap.

According to this, duplexers 61 and 62 and low noise amplifier 21 can be connected with a short line, and thus transfer loss of a reception signal can be decreased.

[3. Circuit Configuration of Radio Frequency Module 1F and Communication Device 5F According to Variation 5]

Figure 5:
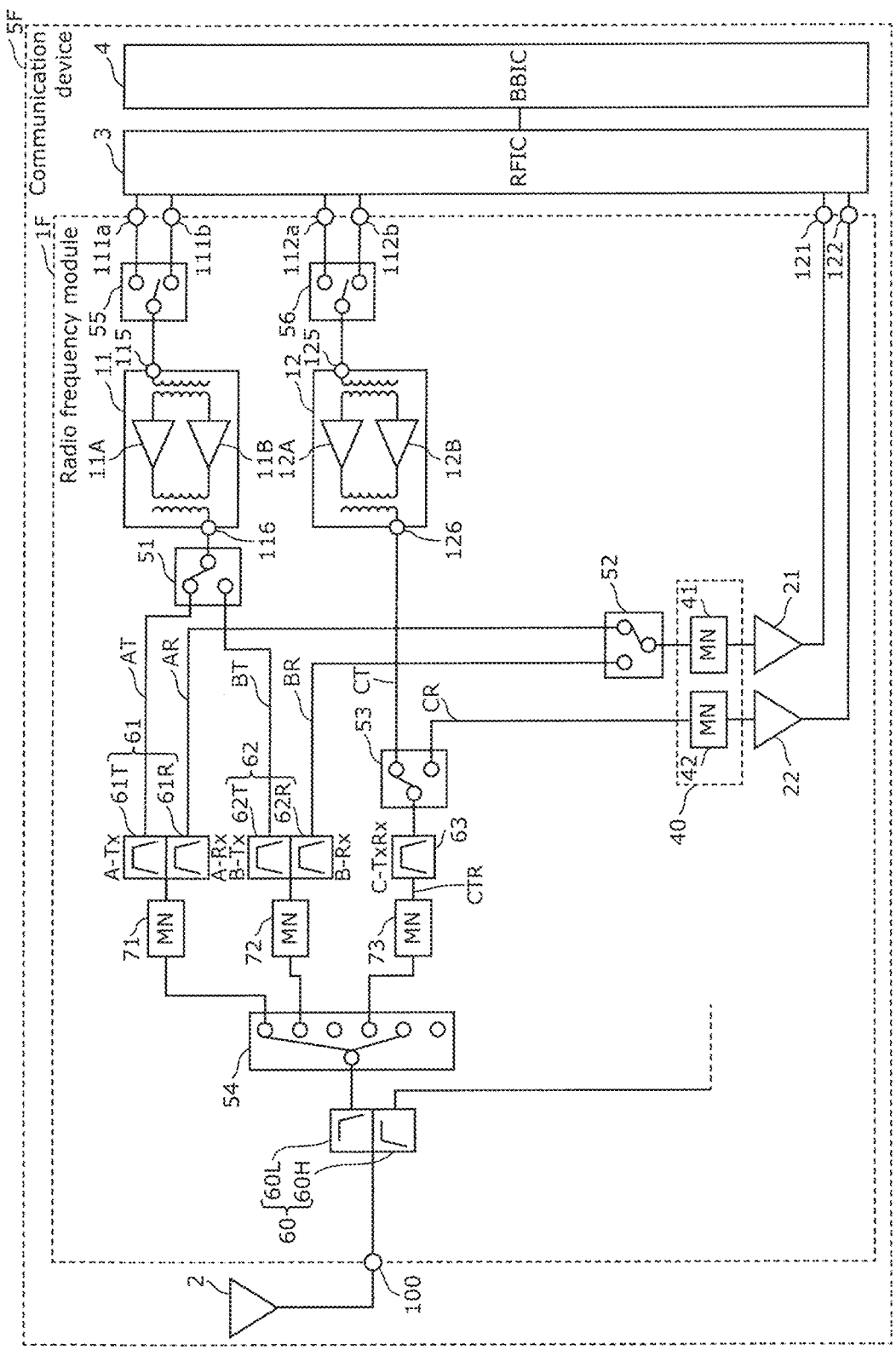
FIG. 5 illustrates a circuit configuration of a radio frequency module and a communication device according to Variation 5.

FIG. 5 illustrates a circuit configuration of radio frequency module 1F and communication device 5F according to Variation 5. As illustrated in FIG. 5, communication device 5F includes radio frequency module 1F, antenna 2, RFIC 3, and BBIC 4. Communication device 5F according to this variation is different from communication device 5 according to the embodiment, only in the configuration of radio frequency module 1F. Accordingly, the following describes communication device 5F according to this variation, focusing on the configuration of radio frequency module 1F.

As illustrated in FIG. 5, radio frequency module 1F includes antenna connection terminal 100, power amplifiers 11 and 12, low noise amplifiers 21 and 22, transmission filters 61T and 62T, reception filters 61R and 62R, filter 63, reception input matching circuit 40, matching circuits 71, 72, and 73, switches 51, 52, 53, 54, 55, and 56, and diplexer 60. Radio frequency module 1F according to this variation is different from radio frequency module 1 according to the embodiment, in that switches 55 and 56 are added. In the following, description of the common points of radio frequency module 1F according to this variation to those of radio frequency module 1 according to the embodiment is omitted, and different points are mainly described.

Power amplifier 11 amplifies radio frequency signals, input through transmission input terminals 111a and 111b, of communication band A (a first communication band) and communication band B (a second communication band) that belong to the first frequency band group. Power amplifier 12 is a differential amplifier that amplifies radio frequency signals, input through transmission input terminals 112a and 112b, of communication band C belonging to a second frequency band group having different frequency bands from the first frequency band group.

Switch 55 has a common terminal and two selection terminals. The common terminal of switch 55 is connected to input terminal 115 of power amplifier 11. One of the selection terminals of switch 55 is connected to transmission input terminal 111a, and the other selection terminal is connected to transmission input terminal 111b. Switch 55 is disposed on the input terminal side of power amplifier 11. This connection configuration allows switch 55 to switch between connecting power amplifier 11 to transmission input terminal 111a and connecting power amplifier 11 to transmission input terminal 111b. Switch 55 includes an SPDT switch circuit, for example.

Switch 56 includes a common terminal and two selection terminals. The common terminal of switch 56 is connected to input terminal 125 of power amplifier 12. One of the selection terminals of switch 56 is connected to transmission input terminal 112a, and the other selection terminal is connected to transmission input terminal 112b. Switch 56 is disposed on the input terminal side of power amplifier 12. This connection configuration allows switch 56 to switch between connecting power amplifier 12 to transmission input terminal 112a and connecting power amplifier 12 to transmission input terminal 112b. Switch 56 includes an SPDT switch circuit, for example.

For example, a transmission signal of communication band A is input through transmission input terminal 111a, and for example, a transmission signal of communication band B is input through transmission input terminal 111b. For example, transmission signals of communication band C are input through transmission input terminals 112a and 112b.

A transmission signal of communication band A or B used in a fourth generation mobile communication system (4G), for example, may be input through transmission input terminal 111a, and a transmission signal of communication band A or B used in a fifth generation mobile communication system (5G), for example, may be input through transmission input terminal 111b. Further, a transmission signal of communication band C used in 4G, for example, is input through transmission input terminal 112a, and a transmission signal of communication band C used in 5G, for example, may be input through transmission input terminal 112b.

Note that switches 55 and 56 may be one SPDT switch circuit that includes a common terminal connected to one transmission input terminal (which is a first transmission input terminal) among transmission input terminals 111a, 111b, 112a, and 112b, one selection terminal connected to input terminal 115 of power amplifier 11, and another selection terminal connected to input terminal 125 of power amplifier 12.

In this case, for example, a transmission signal of one of communication band A, communication band B, and communication band C is selectively input through the first transmission input terminal, the SPDT switch circuit resulting from combining switches 55 and 56 switches between connecting the first transmission input terminal to power amplifier 11 and connecting the first transmission input terminal to power amplifier 12, according to an input transmission signal. For example, a 4G transmission signal and a 5G transmission signal may be input through the first transmission input terminal, and the above switch circuit may switch between connecting the first transmission input terminal to power amplifier 11 and connecting the first transmission input terminal to power amplifier 12, according to an input transmission signal.

Switches 55 and 56 may be achieved by one double pole double throw (DPDT) switch circuit that includes two common terminals and two selection terminals. In this case, a first transmission input terminal is connected to one of the common terminals, and a second transmission input terminal is connected to the other common terminal. One of the selection terminals is connected to power amplifier 11, and the other selection terminal is connected to power amplifier 12. This connection configuration allows the switch circuit to switch between connecting one common terminal out of the common terminals to one selection terminal out of the selection terminals and connecting the one common terminal to the other selection terminal, and switches between connecting the other common terminal to the one selection terminal and connecting the other common terminal to the other selection terminal.

In this case, for example, a transmission signal of communication band A or B is input through the first transmission input terminal, and a transmission signal of communication band C is input through the second transmission input terminal. For example, a 4G transmission signal may be input through the first transmission input terminal, and a 5G transmission signal may be input through the second transmission input terminal.

One end of transmission path AT is connected to switch 55, and the other end of transmission path AT is connected to antenna connection terminal 100. One end of transmission path BT is connected to switch 55, and the other end of transmission path BT is connected to antenna connection terminal 100. One end of transmission path CT is connected to switch 56, and the other end of transmission path CT is connected to antenna connection terminal 100.

In the configuration of radio frequency module 1F, switch 55, power amplifier 11, switch 51, transmission filter 61T, matching circuit 71, switch 54, and filter 60L are included in a first transmission circuit that transfers a transmission signal of communication band A toward antenna connection terminal 100. Filter 60L, switch 54, matching circuit 71, reception filter 61R, switch 52, matching circuit 41, and low noise amplifier 21 are included in a first reception circuit that transfers a reception signal of communication band A from antenna 2 via antenna connection terminal 100.

Switch 55, power amplifier 11, switch 51, transmission filter 62T, matching circuit 72, switch 54, and filter 60L are included in a second transmission circuit that transfers a transmission signal of communication band B toward antenna connection terminal 100. Filter 60L, switch 54, matching circuit 72, reception filter 62R, switch 52, matching circuit 41, and low noise amplifier 21 are included in a second reception circuit that transfers a reception signal of communication band B from antenna 2 via antenna connection terminal 100.

Switch 56, power amplifier 12, switch 53, filter 63, matching circuit 73, switch 54, and filter 60L are included in a third transmission circuit that transfers a transmission signal of communication band C toward antenna connection terminal 100. Filter 60L, switch 54, matching circuit 73, filter 63, switch 53, matching circuit 42, and low noise amplifier 22 are included in a third reception circuit that transfers a reception signal of communication band C from antenna 2 via antenna connection terminal 100.

According to the above circuit configuration, radio frequency module 1F can carry out at least one of simultaneous transmission, simultaneous reception, or simultaneous transmission and reception of a radio frequency signal of communication band A or B and a radio frequency signal of communication band C.

[4. Arrangement of Circuit Elements of Radio Frequency Module 1G According to Variation 6]

Figure 6B:
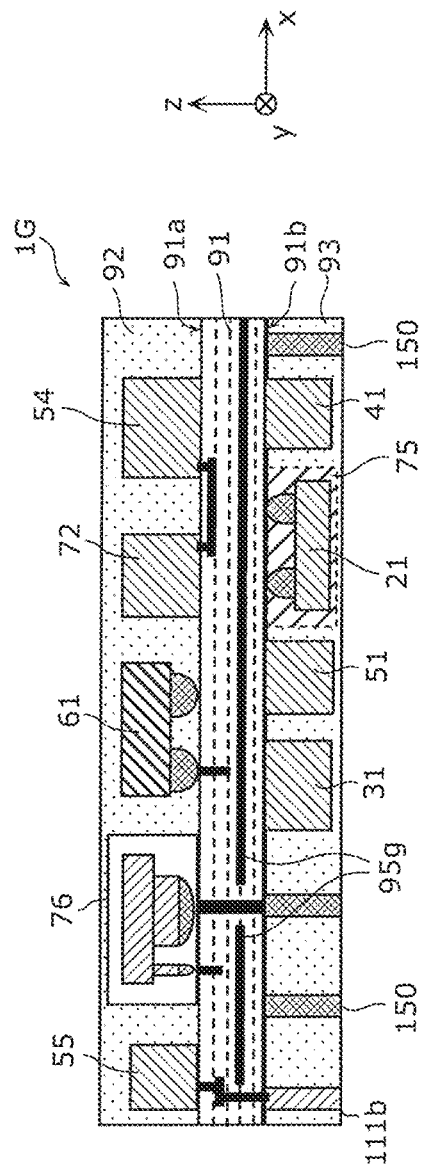
FIG. 6B is a schematic diagram illustrating a cross-sectional configuration of the radio frequency module according to Variation 6.

FIG. 6A is a schematic diagram illustrating a planar configuration of radio frequency module 1G according to Variation 6. FIG. 6B is a schematic diagram illustrating a cross-sectional configuration of radio frequency module 1G according to Variation 6 and specifically, illustrates a cross section taken along line VIB to VIB in FIG. 6A. Note that (a) of FIG. 6A illustrates a layout of circuit elements when principal surface 91*a* out of principal surfaces 91*a* and 91*b* on opposite sides of module board 91 is viewed from the positive z-axis. On the other hand, (b) of FIG. 6A is a perspective view of layout of circuit elements when principal surface 91*b* is viewed from the positive z-axis.

Radio frequency module 1G according to Variation 6 specifically shows the arrangement of circuit elements included in radio frequency module 1F according to Variation 5.

Radio frequency module 1G according to this variation is different from radio frequency module 1A according to the example, in the arrangement of circuit elements included in radio frequency module 1G. The following description of radio frequency module 1G according to this variation focuses on differences from radio frequency module 1A according to the example while a description of the same points is omitted.

As illustrated in FIGS. 6A and 6B, amplification elements 11A, 11B, 12A, and 12B, interstage transformers 33 and 38, capacitors 32 and 37, duplexers 61 and 62, filter 63, matching circuits 71, 72, and 73, and switches 54, 55, and 56 are mounted on principal surface 91*a* of module board 91, in radio frequency module 1G according to this variation. On the other hand, low noise amplifiers 21 and 22, output transformers 31 and 36, matching circuits 41 and 42, switches 51, 52, and 53, and diplexer 60 are mounted on principal surface 91*b* of module board 91.

In this variation, low noise amplifiers 21 and 22 and switches 51, 52, and 53 are first circuit components, and are disposed on principal surface 91*b*. On the other hand, amplification elements 11A, 11B, 12A, and 12B are disposed on principal surface 91*a*.

According to the above configuration, amplification elements 11A, 11B, 12A, and 123 and the first circuit components are disposed on two sides of module board 91 with module board 91 therebetween. Accordingly, radio frequency module 1G can be miniaturized, as compared with a configuration in which amplification elements 11A, 11B, 12A, and 12B and the first circuit components are all disposed on one side of module board 91. Amplification elements 11A, 11B, 12A, and 123 and the first circuit components are disposed with module board 91 therebetween, so that transmission signals output from amplification elements 11A, 11B, 12A, and 12B can be prevented from being coupled with the first circuit components via an electric field, a magnetic field, or an electromagnetic field. Accordingly, small radio frequency module 1G in which transfer loss of the transmission signals is reduced can be provided.

Note that amplification elements 11A, 11B, 12A, and 12B may be disposed on principal surface 91*b*, and the first circuit components may be disposed on principal surface 91*a*. Also, this can miniaturize radio frequency module 1G, and can prevent transmission signals output from amplification elements 11A, 11B, 12A, and 12B from being coupled with the first circuit components via an electric field, a magnetic field, or an electromagnetic field.

In radio frequency module 1G according to this variation, as illustrated in FIG. 6A, amplification elements 11A and 11B and interstage transformer 33 may be included in one semiconductor IC 76. Further, as illustrated in FIG. 6A, amplification elements 12A and 12B and interstage transformer 38 may be included in one semiconductor IC 77.

Accordingly, amplification elements 11A and 11B included in power amplifier 11, and interstage transformer 33 are close to one another, and amplification elements 12A and 12B included in power amplifier 12 and interstage transformer 38 are close to one another, and thus radio frequency module 1G can be miniaturized. Further, lines that connect amplification elements 11A and 11B to interstage transformer 33, and lines that connect amplification elements 12A and 12B to interstage transformer 38 can be shortened, and thus transfer loss of transmission signals can be reduced.

In radio frequency module 1G according to this variation, as illustrated in FIG. 6A, low noise amplifiers 21 and 22 and switches 52 and 53 may be included in one semiconductor IC 75.

Accordingly, low noise amplifiers 21 and 22 and switches 52 and 53 included in reception circuits are close to one another, and thus radio frequency module 1G can be miniaturized. Lines that connect low noise amplifiers 21 and 22 to switches 52 and 53 can be shortened, and thus transfer loss of reception signals can be reduced.

Furthermore, matching circuit 41 connected between low noise amplifier 21 and switch 52, and matching circuit 42 connected between low noise amplifier 21 and switch 52 may be disposed on principal surface 91b, adjacently to semiconductor IC 75.

Accordingly, low noise amplifiers 21 and 22, switches 52 and 53, and matching circuits 41 and 42 included in reception circuits are adjacent to one another, and thus radio frequency module 1G can be further miniaturized. Moreover, lines that connect low noise amplifiers 21 and 22 to switches 52 and 53 can be shortened, and thus transfer loss of reception signals can be further reduced.

Note that when matching circuits 41 and 42 are disposed on principal surface 91b, inductors or capacitors included in matching circuits 41 and 42 may be desirably integrated passive devices (IPDs) mounted on the surface or inside of a Si substrate, for example. According to this, the height of matching circuits 41 and 42 can be reduced.

In radio frequency module 1G according to this variation, switch 55 and semiconductor IC 76 are adjacently disposed as illustrated in FIG. 6A. As illustrated in FIG. 6A, switch 56 and semiconductor IC 77 are adjacently disposed. In a plan view of module board 91, at least one of transmission input terminal 111a or 111b may be disposed in a region included in principal surface 91b and overlapping switch 55. In a plan view of module board 91, at least one of transmission input terminal 112a or 112b may be disposed in a region included in principal surface 91b and overlapping switch 56.

Accordingly, transmission paths that connect the four transmission input terminals to power amplifiers 11 and 12 can be shortened, and thus transfer loss of transmission signals can be reduced.

Note that a state in which "circuit element A and circuit element B are adjacently disposed" means that no other circuit element is disposed between circuit element A and circuit element B, in a plan view of module board 91.

In radio frequency module 1G according to this variation, duplexers 61 and 62 may be disposed on principal surface 91a, and output transformer 31 may be disposed on principal surface 91b, as illustrated in FIG. 6A. At this time, it is desirable that in a plan view of module board 91, ground electrode layer 95g and output transformer 31 at least partially overlap, and ground electrode layer 95g and at least one of duplexer 61 or 62 at least partially overlap. Note that ground electrode layer 95g is an electric conduction pattern formed on module board 91 in a direction parallel to principal surfaces 91a and 91b and having the ground potential.

According to this, ground electrode layer 95g is disposed between output transformer 31 and duplexers 61 and 62, a high-power transmission signal output from output transformer 31 and harmonics thereof can be prevented from leaking to reception paths via duplexers 61 and 62. Accordingly, deterioration of reception sensitivity can be reduced.

In a plan view of module board 91, it is desirable that duplexers 61 and 62 and output transformer 31 at least partially overlap. Accordingly, transmission paths that connect duplexers 61 and 62 to output transformer 31 can be shortened, and thus transfer loss of transmission signals can be reduced.

[5. Arrangement of Circuit Elements of Radio Frequency Module 1H According to Variation 7]

FIG. 7A is a schematic diagram illustrating a planar configuration of radio frequency module 1H according to Variation 7. FIG. 73 is a schematic diagram illustrating a cross-sectional configuration of radio frequency module 1H according to Variation 7 and specifically, illustrates a cross section taken along line VIIB to VIIB in FIG. 7A. Note that (a) of FIG. 7A illustrates a layout of circuit elements when principal surface 91a out of principal surfaces 91a and 91b on opposite sides of module board 91 is viewed from the positive z-axis. On the other hand, (b) of FIG. 7A is a perspective view of layout of circuit elements when principal surface 91b is viewed from the positive z-axis. Output transformers 31 and 36 formed inside of module board 91 are illustrated to FIG. 7A with dashed lines.

Radio frequency module 1H according to Variation 7 specifically shows the arrangement of circuit elements included in radio frequency module 1F according to Variation 5.

Radio frequency module 1H according to this variation is different from radio frequency module 1A according to the example, in the arrangement of circuit elements included in radio frequency module 1H. The following description of radio frequency module 1H according to this variation focuses on differences from radio frequency module 1A according to the example while a description of the same points is omitted.

Module board 91 is a board which includes principal surface 91a (a second principal surface) and principal surface 91b (a first principal surface) on opposite sides of module board 91, and on which the above transmission circuits and the above reception circuits are mounted. As module board 91, for example, one of an LTCC board, an HTCC board, a component-embedded board, a board that includes an RDL, and a printed circuit board each having a stacked structure of a plurality of dielectric layers is used.

Figure 7B:
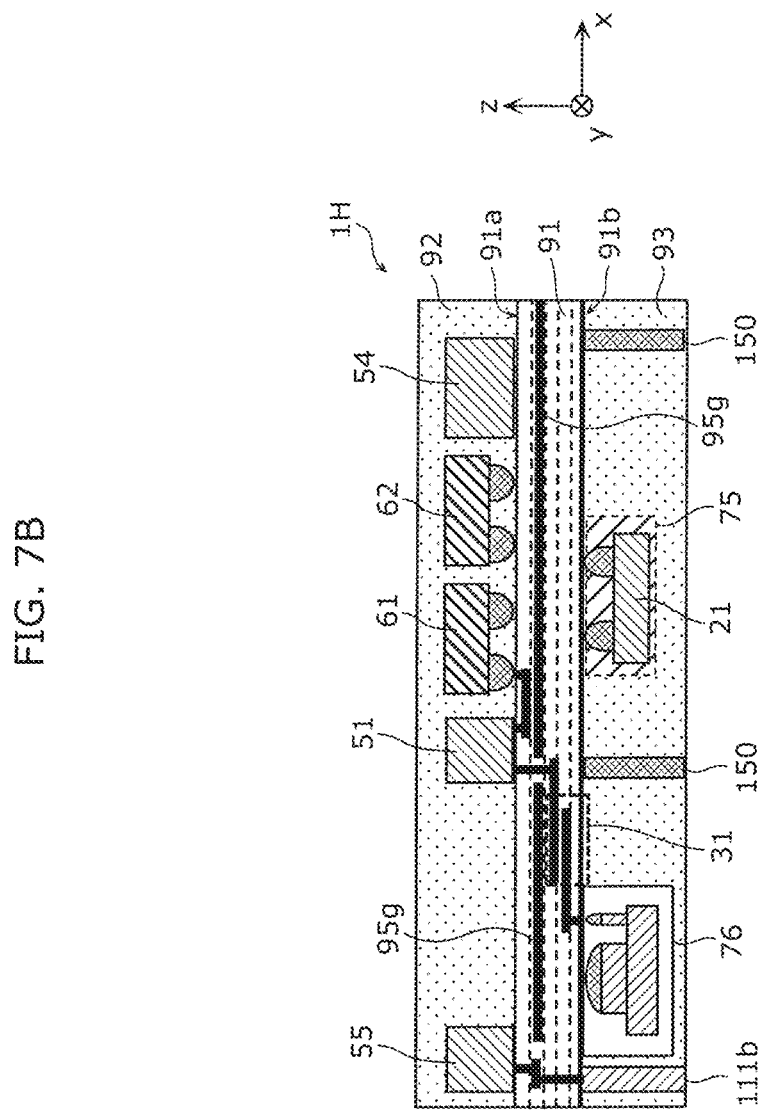
FIG. 7B is a schematic diagram illustrating a cross-sectional configuration of the radio frequency module according to Variation 7.

As illustrated in FIGS. 7A and 7B, in radio frequency module 1H according to this variation, capacitors 32 and 37, duplexers 61 and 62, filter 63, matching circuits 41 and 42, and switches 51 and 54 are mounted on principal surface 91a (a second principal surface) of module board 91. On the other hand, amplification elements 11A, 110, 12A, and 123, interstage transformers 33 and 38, low noise amplifiers 21 and 22, switches 52 and 53, and diplexer 60 are mounted on principal surface 91b (a first principal surface) of module board 91. Output transformers 31 and 36 are formed inside of module board 91. Note that although not illustrated in FIG. 7A or 7B, matching circuits 71 to 73 may be mounted on any of principal surfaces 91a and 91b of module board 91 or provided inside of module board 91.

In this variation, capacitors 32 and 37, duplexers 61 and 62, filter 63, matching circuits 41 and 42, and switches 51 and 54 are first circuit components, and are disposed on principal surface 91a (the second principal surface). On the other hand, amplification elements 11A, 11B, 12A, and 12B are disposed on principal surface 91b (the first principal surface).

According to the above configuration, amplification elements 11A, 11B, 12A, and 12B and the first circuit components are disposed on two sides of module board 91, with module board 91 therebetween. Accordingly, radio frequency module 1H can be miniaturized, as compared with a configuration in which amplification elements 11A, 11B, 12A, and 12B and the first circuit components are all disposed on one side of module board 91. Amplification elements 11A, 11B, 12A, and 12B and the first circuit components are disposed with module board 91 therebetween, and thus transmission signals output from amplification elements 11A, 11B, 12A, and 12B can be prevented from being coupled with the first circuit components via an electric field, a magnetic field, or an electromagnetic field. Accordingly, small radio frequency module 1H in which transfer loss of the transmission signals is reduced can be provided.

In radio frequency module 1H according to this variation, amplification elements 11A and 11B and interstage transformer 33 may be included in one semiconductor IC 76, as illustrated in FIG. 7A. As illustrated in FIG. 7A, amplification elements 12A and 12B and interstage transformer 38 may be included in one semiconductor IC 77.

Accordingly, interstage transformer 33 and amplification elements 11A and 11B included in power amplifier 11 are adjacently disposed, and interstage transformer 38 and amplification elements 12A and 12B included in power amplifier 12 are adjacently disposed, and thus radio frequency module 1H can be miniaturized. Lines that connect amplification elements 11A and 118 to interstage transformer 33, and lines that connect amplification elements 12A and 12B to interstage transformer 38 can be shortened, transfer loss of transmission signals can be reduced.

In radio frequency module 1H according to this variation, low noise amplifiers 21 and 22 and switches 52 and 53 may be included in one semiconductor IC 75, as illustrated in FIG. 7A.

Accordingly, low noise amplifiers 21 and 22 and switches 52 and 53 included in reception circuits are disposed adjacently, and thus radio frequency module 1H can be miniaturized. In addition, the lines that connect low noise amplifiers 21 and 22 to switches 52 and 53 can be shortened, and thus transfer loss of reception signals can be reduced.

In radio frequency module 1H according to this variation, as illustrated in FIG. 7A, switch 55 and semiconductor IC 76 are separately disposed on principal surfaces 91a and 91b, and in a plan view of module board 91, switch 55 and semiconductor IC 76 at least partially overlap. Accordingly, transmission paths that connect transmission input terminals 111a and 111b to power amplifier 11 can be shortened, and thus transfer loss of transmission signals can be reduced.

As illustrated in FIG. 7A, switch 56 and semiconductor IC 77 are separately disposed on principal surfaces 91a and 91b, and in a plan view of module board 91, switch 56 and semiconductor IC 77 may at least partially overlap. Accordingly, transmission paths that connect transmission input terminals 112a and 112b to power amplifier 12 can be shortened, and thus transfer loss of transmission signals can be reduced.

In radio frequency module 1H according to this variation, as illustrated in FIG. 7A, in a plan view of module board 91, it is desirable that amplification elements 11A and 118 and output transformer 31 do not overlap, and amplification elements 12A and 12B and output transformer 36 do not overlap.

Accordingly, amplification elements 11A and 11B and secondary coil 31b of output transformer 31 can be prevented from being unnecessarily coupled with one another via a magnetic field or an electromagnetic field, and amplification elements 12A and 126 and secondary coil 36b of output transformer 36 can be prevented from being unnecessarily coupled with one another via a magnetic field or an electromagnetic field. Accordingly, this can reduce an increase in transfer loss and an increase in spurious waves due to a decrease in the degree of impedance matching of power amplifiers 11 and 12.

As illustrated in FIGS. 7A and 7B, in a plan view of module board 91, no circuit component is desirably disposed in regions included in principal surface 91a and principal surface 91b and overlapping a formation region in which output transformers 31 and 36 are formed. Accordingly, the fall of amplification performance of power amplifiers 11 and 12 can be reduced.

In radio frequency module 1H according to this variation, a plurality of external-connection terminals 150 are disposed on principal surface 91b (a first principal surface) of module board 91. External-connection terminals 150 used as ground electrodes are disposed between low noise amplifiers 21 and 22 that greatly affect reception sensitivity of reception circuits and power amplifiers 11 and 12, and thus deterioration of reception sensitivity of the reception circuits can be reduced.

In radio frequency module 1H according to this variation, as illustrated in FIG. 7A, duplexers 61 and 62 are disposed on principal surface 91a, and output transformer 31 may be disposed on principal surface 91b. At this time, in a plan view of module board 91, it is desirable that ground electrode layer 95g and output transformer 31 at least partially overlap, and ground electrode layer 95g and at least one of duplexer 61 or 62 at least partially overlap.

According to this, ground electrode layer 95g is disposed between output transformer 31 and duplexers 61 and 62, and thus a high-power transmission signal output from output transformer 31 and harmonics thereof can be prevented from leaking to reception paths via duplexers 61 and 62. Consequently, deterioration of reception sensitivity can be reduced.

In radio frequency module 1H according to this variation, as illustrated in FIGS. 7A and 7B, semiconductor IC 76, output transformer 31, switch 51, duplexers 61 and 62, and switch 54 are disposed in the order from the left end of module board 91 (the end of the negative x-axis in FIGS. 7A and 7B) to the right end (the end of the positive x-axis in FIGS. 7A and 7B).

According to this, transmission signals of communication bands A and B can be transferred in radio frequency module 1H, from the left end of module board 91 to the right end in substantially one direction, and can be prevented from returning in the opposite direction. Accordingly, the transfer paths of transmission signals of communication bands A and B are shortened, and thus transfer loss of the transmission signals can be reduced.

[6. Advantageous Effects and Others]

As described above, radio frequency module 1 according to the present embodiment includes: module board 91 that includes principal surface 91a and principal surface 91b on opposite sides of module board 91; power amplifier 11; and a first circuit component. Power amplifier 11 includes: amplifying element 11A; amplifying element 11B; and output transformer 31 that includes primary coil 31a and secondary coil 31b. An end of primary coil 31a is connected to an output terminal of amplifying element 11A, and another end of primary coil 31a is connected to an output terminal of amplifying element 11B. An end of secondary coil 31b is connected to output terminal 116 of power amplifier 11. Amplifying element 11A and amplifying element 11B are disposed on principal surface 91a. The first circuit component is disposed on principal surface 91b.

Accordingly, amplifying elements 11A and 11B and the first circuit component are disposed on two sides of module board 91 with module board 91 therebetween. Accordingly, radio frequency module 1 can be miniaturized, as compared with a configuration in which amplifying elements 11A and 11B and the first circuit component are all disposed on one side of module board 91. Amplifying elements 11A and 11B and the first circuit component are disposed with module board 91 therebetween, so that transmission signals output from amplifying elements 11A and 11B can be prevented from being coupled with the first circuit component via an electric field, a magnetic field, or an electromagnetic field. Accordingly, small radio frequency module 1 in which transfer loss of the transmission signal is decreased can be provided.

Radio frequency module 1 further includes: transmission input terminal 111; reception output terminal 121; and antenna connection terminal 100. The first circuit component is a circuit component connected to reception path AR or BR connected to reception output terminal 121 and antenna connection terminal 100, and in a plan view of module board 91, output transformer 31 and the first circuit component disposed on principal surface 91b may not overlap.

Accordingly, transmission signals that are output from amplifying elements 11A and 11B and transferred in output transformer 31 can be prevented from being coupled with one or more first circuit components disposed on one or both of reception paths AR and BR via a magnetic field or an electromagnetic field. Accordingly, isolation of power amplifier 11 from the reception circuits improves, and thus this can effectively reduce a decrease in reception sensitivity caused by the transmission signals, harmonics, and spurious waves due to intermodulation distortion sneaking into at least one of reception path AR or BR.

In radio frequency nodule 1, the first circuit component may be low noise amplifier 21.

Accordingly, transmission signals that are output from amplifying elements 11A and 11B and transferred in output transformer 31 can be prevented from being coupled with low noise amplifier 21 via a magnetic field or an electromagnetic field. Accordingly, isolation of power amplifier 11 from low noise amplifier 21 improves, and thus this can further reduce a decrease in reception sensitivity caused by the transmission signals, harmonics, and spurious waves due to intermodulation distortion sneaking into the reception path.

In radio frequency module 1, in a plan view of module board 91, desirably, amplifying element 11A and output transformer 31 do not overlap, and amplifying element 11B and output transformer 31 do not overlap.

Accordingly, amplifying elements 11A and 11B and secondary coil 31b can be prevented from being unnecessarily coupled with each other via a magnetic field or an electromagnetic field. Accordingly, an increase in transfer loss and an increase in unnecessary waves due to a decrease in the degree of impedance matching inside of power amplifier 11 can be reduced.

In radio frequency module 1, desirably, module board 91 includes ground electrode layer 95g formed in a direction parallel to principal surface 91a and principal surface 91b, and in a plan view of module board 91, ground electrode layer 95g is not formed in a region overlapping output transformer 31.

According to this, it can be ensured that output transformer 31 and ground electrode 95g are widely spaced apart from each other, and thus transfer loss of a transmission signal transferred in power amplifier 11 can be decreased.

In radio frequency module 1, output transformer 31 may not be formed inside of module board 91, between principal surface 91a and principal surface 91b.

According to this, it is not necessary to dispose output transformer 31 on principal surface 91a or principal surface 91b, and thus the area for radio frequency module 1 can be reduced.

In radio frequency module 1, in a plan view of module board 91, desirably, no circuit component is disposed in a region included in principal surface 91a and overlapping output transformer 31, or in a region included in principal surface 91b and overlapping output transformer 31.

According to this, no circuit component is disposed in the region included in principal surface 91a or the region included in principal surface 91b, and thus a decrease in the Q factor of the inductor of output transformer 31 can be reduced.

In radio frequency module 1A/1C, output transformer 31 may be formed inside of module board 91 between principal surface 91a and principal surface 91b, output transformer 31 being offset toward one of principal surface 91a and principal surface 91b, and in a plan view of module board 91, no circuit component may be disposed in a region included in the one of principal surface 91a and principal surface 91b, and overlapping output transformer 31, and a circuit component may be disposed in a region included in the other of principal surface 91a and principal surface 91b, and overlapping output transformer 31.

Also in this case, no circuit component is disposed in the region included in principal surface 91a or 91b closer to output transformer 31, and thus a decrease in the Q factor of the inductor of output transformer 31 can be reduced.

In radio frequency module 1E, desirably, output transformer 31 is disposed on principal surface 91a, and in a plan view of module board 91, no circuit component is disposed in a region included in principal surface 91b and overlapping output transformer 31.

According to this, no circuit component is disposed in the region in principal surface 91b, and thus a decrease in the Q factor of the inductor of output transformer 31 can be reduced.

In radio frequency module 1D, desirably, output transformer 31 is disposed on principal surface 91b, and in a plan view of module board 91, no circuit component is disposed in a region included in principal surface 91a and overlapping output transformer 31.

According to this, no circuit component is disposed in the region in principal surface 91a, and thus a decrease in the Q factor of the inductor of output transformer 31 can be reduced.

Radio frequency module 1G may further include: duplexer 61 configured to pass a transmission signal of communication band A and a reception signal of communication band A. Duplexer 61 may include: transmission filter 61T that includes an input end connected to output terminal 116 of power amplifier 11; and reception filter 61R that includes an input end connected to an output end of transmission filter 61T. Duplexer 61 may be disposed on principal surface 91a. Module board 91 may include ground electrode layer 95g formed in a direction parallel to principal surface 91a and principal surface 91b. In a plan view of module board 91, ground electrode layer 95g and output transformer 31 may at least partially overlap, and ground electrode layer 95g and duplexer 61 may at least partially overlap.

According to this, ground layer 95g is disposed between duplexer 61 and output transformer 31, and thus a high-power transmission signal output from output transformer 31 and harmonics thereof can be prevented from leaking to a reception path via duplexer 61. Consequently, deterioration of reception sensitivity can be reduced.

In radio frequency module 1G, in a plan view of module board 91, output transformer 31 and duplexer 61 may at least partially overlap.

Accordingly, a transmission path that connects duplexer 61 and output transformer 31 can be shortened, and thus transfer loss of a transmission signal can be decreased.

In radio frequency module 1, external-connection terminal 150 may be disposed on principal surface 91b.

According to this, power amplifier 11 is mounted on principal surface 91a, and power amplifier 11 and external-connection terminal 150 can be connected via a penetrating electrode that passes through module board 91 between principal surface 91a and principal surfaces 91b. Accordingly, as heat dissipation paths for transmission power amplifier 11, a heat dissipation path extending along only a planar line pattern in the xy plane direction and having high heat resistance can be excluded from lines on and in module board 91. Thus, miniaturized radio frequency module 1 having improved heat dissipation from transmission power amplifier 11 to the motherboard can be provided.

In radio frequency module 1H, external-connection terminal 150 may be disposed on principal surface 91b.

According to this, amplifying elements 11A, 11B, 12A, and 12B and the first circuit component are disposed on two sides of module board 91, with module board 91 therebetween. Accordingly, radio frequency module 1H can be miniaturized, as compared with a configuration in which amplifying elements 11A, 11B, 12A, and 12B and the first circuit component are all disposed on one side of module board 91.

A radio frequency module according to another aspect may include: module board 91 that includes principal surface 91a and principal surface 91b on opposite sides of module board 91; and power amplifier 11. Power amplifier 11 may include: amplifying element 11A; amplifying element 11B; and output transformer 31 that includes primary coil 31a and secondary coil 31b. An end of primary coil 31a may be connected to an output terminal of amplifying element 11A, and another end of primary coil 31a may be connected to an output terminal of amplifying element 11B. An end of secondary coil 31b may be connected to output terminal 116 of power amplifier 11. Amplifying element 11A may be disposed on principal surface 91a, and amplifying element 11B may be disposed on principal surface 91b.

According to this, amplifying element 11A and amplifying element 11B are disposed on two sides of module board 91 with module board 91 therebetween. Accordingly, the radio frequency module can be miniaturized, as compared with a configuration in which both amplifying elements 11A and 11B are disposed on one side of module board 91. Further, amplifying element 11A and amplifying element 11B are disposed with module board 91 therebetween, and thus a balanced transmission signal output from amplifying element 11A and a balanced transmission signal output from amplifying element 11B can be prevented from being coupled with each other via an electric field, a magnetic field, or an electromagnetic field before the signals are input to output transformer 31. Accordingly, a small radio frequency module in which transfer loss of the transmission signals is decreased can be provided.

Communication device 5 includes: antenna 2; RFIC configured to process a radio frequency signal to be transmitted by antenna 2 and a radio frequency signal received by antenna 2; and radio frequency module 1 configured to transfer the radio frequency signals between antenna 2 and RFIC 3.

Accordingly, small communication device 5 that includes a difference amplifying type power amplifier can be provided.

Other Embodiments

The above has described the radio frequency module and the communication device according to the present disclosure, using the embodiment and the examples, yet the radio frequency module and the communication device according to the present disclosure are not limited to the embodiment and the examples. The present disclosure also encompasses another embodiment achieved by combining arbitrary elements in the embodiment and the examples, variations as a result of applying various modifications that may be conceived by those skilled in the art to the embodiment and the examples without departing from the scope of the present disclosure, and various apparatuses that include the radio frequency module and the communication device according to the present disclosure.

For example, in the radio frequency modules and the communication devices according to the embodiment and the examples thereof, another circuit element and another line, for instance, may be disposed between circuit elements and paths that connect signal paths illustrated in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a radio frequency module disposed in a front end portion that supports multiband technology.

The invention claimed is:
1. A radio frequency module, comprising
a module board that includes a first principal surface and a second principal surface on opposite sides of the module board;
a power amplifier configured to amplify a transmission signal; and
an external-connection terminal disposed on the second principal surface;
wherein the power amplifier includes:
a first amplifying circuit element;
a second amplifying circuit element; and
an output transformer that includes a first coil and a second coil,
an end of the first coil is connected to an output terminal of the first amplifying circuit element, another end of the first coil is connected to an output terminal of the second amplifying circuit element, an end of the second coil is connected to an output terminal of the power amplifier, the output transformer is a chip inductor and disposed on the second principal surface.

2. The radio frequency module according to claim 1, wherein the first amplifying circuit element and the second amplifying circuit element are disposed on the first principal surface, and in a plan view of the module board, the output transformer do not overlap the first amplifying circuit element and the second amplifying circuit element.

3. The radio frequency module according to claim 2, further comprising:

a duplexer disposed on the first principal surface and configured to pass a transmission signal of the first communication band and a reception signal of the first communication band, an electric conduction pattern formed on module board in a direction parallel to the first principal surface and the second principal surface and having the ground potential, wherein the duplexer is connected to the power amplifier;

in a plan view of the module board, at least one of the electric conduction pattern overlap at least one of the output transformer, and at least one of the electric conduction pattern overlap at least one of the duplexer.

4. The radio frequency module according to claim 3, further comprising:

a duplexer disposed on the first principal surface and configured to pass a transmission signal of the first communication band and a reception signal of the first communication band, wherein the duplexer is connected to the power amplifier;

in a plan view of the module board, at least one of the duplexer overlap at least one of the output transformer.

5. The radio frequency module according to claim 2, further comprising:

a duplexer disposed on the first principal surface and configured to pass a transmission signal of the first communication band and a reception signal of the first communication band, wherein the duplexer is connected to the power amplifier;

in a plan view of the module board, at least one of the duplexer overlap at least one of the output transformer.

6. The radio frequency module according to claim 1, further comprising:

a duplexer disposed on the first principal surface and configured to pass a transmission signal of the first communication band and a reception signal of the first communication band, an electric conduction pattern formed on module board in a direction parallel to the first principal surface and the second principal surface and having the ground potential, wherein the duplexer is connected to the power amplifier;

in a plan view of the module board, at least one of the electric conduction pattern overlap at least one of the output transformer, and at least one of the electric conduction pattern overlap at least one of the duplexer.

7. The radio frequency module according to claim 6, further comprising:

a duplexer disposed on the first principal surface and configured to pass a transmission signal of the first communication band and a reception signal of the first communication band, wherein the duplexer is connected to the power amplifier;

in a plan view of the module board, at least one of the duplexer overlap at least one of the output transformer.

8. The radio frequency module according to claim 1, further comprising:

a duplexer disposed on the first principal surface and configured to pass a transmission signal of the first communication band and a reception signal of the first communication band, wherein the duplexer is connected to the power amplifier;

in a plan view of the module board, at least one of the duplexer overlap at least one of the output transformer.

9. The radio frequency module according to claim 1, wherein the output transformer is an integrated passive device (TPU).

10. The radio frequency module according to claim 1, further comprising:

an input terminal disposed on the second principal surface; and a first semiconductor IC disposed on the second principal surface, wherein the power amplifier includes a third amplifying circuit element and an interstage transformer including an unbalance terminal, a first balance terminal and a second balance terminal;

an input terminal of the third amplifying circuit element is connected to the input terminal;

an output terminal of the third amplifying circuit element is connected to the unbalance terminal;

the first balance terminal is connected to an input of the first amplifying circuit element;

the second balance terminal is connected to an input of the second amplifying circuit element; and the first semiconductor IC includes the first amplifying circuit element, the second amplifying circuit element, and the interstage transformer.

* * * * *